(12) United States Patent  
Gopalakrishnan

(10) Patent No.: US 8,817,533 B2  
(45) Date of Patent: **\*Aug. 26, 2014**

(54) CROSSPOINT ARRAY AND METHOD OF USE WITH A CROSSPOINT ARRAY HAVING CROSSBAR ELEMENTS HAVING A SOLID ELECTROLYTE MATERIAL USED AS A RECTIFIER WITH A SYMMETRIC OR SUBSTANTIALLY SYMMETRIC RESISTIVE MEMORY

(75) Inventor: Kailash Gopalakrishnan, San Jose, CA (US)

(73) Assignee: International Business Machines Corporation, Armonk, NY (US)

( \* ) Notice: Subject to any disclaimer, the term of this patent is extended or adjusted under 35 U.S.C. 154(b) by 142 days.

This patent is subject to a terminal disclaimer.

(21) Appl. No.: 13/487,427

(22) Filed: Jun. 4, 2012

(65) Prior Publication Data

US 2012/0243291 A1 Sep. 27, 2012

Related U.S. Application Data

(60) Division of application No. 12/110,644, filed on Apr. 28, 2008, now Pat. No. 8,203,873, which is a continuation of application No. 11/679,785, filed on Feb. 27, 2007, now Pat. No. 7,382,647.

(51) Int. Cl.  
*G11C 11/00* (2006.01)

(52) U.S. Cl.  
USPC ............................ 365/163; 365/100; 365/148

(58) Field of Classification Search  
USPC .......................................... 365/163, 100, 148  
See application file for complete search history.

(56) References Cited

U.S. PATENT DOCUMENTS

| 4,795,657 | A | 1/1989 | Formigoni et al. |
| 6,574,129 | B1 | 6/2003 | Tran |
| 6,633,497 | B2 | 10/2003 | Nickel |

(Continued)

FOREIGN PATENT DOCUMENTS

| DE | 102004037152 A1 | 3/2006 |
| JP | 2007113568 | 5/2007 |

(Continued)

OTHER PUBLICATIONS

Beck et al., "Reproducible Switching Effect in Thin Oxide Films for Memory Applications," Applied Physics Letters, AIP, V77, N1, Jul. 3, 2000, pp. 139-141.

(Continued)

*Primary Examiner* — Son Dinh  
(74) *Attorney, Agent, or Firm* — IP Authority, LLC; Ramraj Soundararajan

(57) ABSTRACT

A crosspoint array has been shown having a plurality of bitlines and wordlines; and a plurality of crossbar elements, with each crossbar element being disposed between a bitline and a wordline and with each crossbar element having at least a solid electrolyte material used as a rectifier in series with a symmetric or substantially symmetric resistive memory node. The crossbar elements are responsive to the following voltages: a first set of voltages to transition the solid electrolyte in the crossbar elements from an OFF state to an ON state, a second set of voltages to read or program the symmetric resistive memory, and a third set of voltages to transition solid electrolyte from an ON state to an OFF state.

20 Claims, 27 Drawing Sheets

(56) References Cited

U.S. PATENT DOCUMENTS

| | | |
|---|---|---|
| 6,670,824 B2 | 12/2003 | Goodbread et al. |
| 6,678,189 B2 | 1/2004 | Tran |
| 6,754,097 B2 | 6/2004 | Sharma et al. |
| 6,778,426 B2 | 8/2004 | Hosotani |
| 6,855,975 B2 | 2/2005 | Gilton |
| 6,885,573 B2 | 4/2005 | Sharma et al. |
| 6,927,996 B2 | 8/2005 | Eaton et al. |
| 6,954,385 B2 * | 10/2005 | Casper et al. ............ 365/189.07 |
| 6,980,463 B2 | 12/2005 | Hosotani et al. |
| 6,987,689 B2 | 1/2006 | Bozano et al. |
| 7,031,185 B2 | 4/2006 | Perner et al. |
| 7,034,332 B2 | 4/2006 | Stasiak et al. |
| 7,042,757 B2 | 5/2006 | Perner |
| 7,046,546 B1 | 5/2006 | Inaba |
| 7,074,519 B2 * | 7/2006 | Kuhr et al. ..................... 429/149 |
| 7,382,647 B1 * | 6/2008 | Gopalakrishnan ............ 365/163 |
| 7,929,335 B2 | 4/2011 | Gopalakrishnan |
| 2006/0067112 A1 | 3/2006 | Ferrant et al. |
| 2007/0165434 A1 | 7/2007 | Lee et al. |
| 2008/0089121 A1 | 4/2008 | Aochi et al. |

FOREIGN PATENT DOCUMENTS

| | | |
|---|---|---|
| WO | 2006007525 A1 | 1/2006 |
| WO | 2006077747 A | 7/2006 |
| WO | 2006115208 A | 11/2006 |

OTHER PUBLICATIONS

Baek et al., "Multi-Layer Cross-Point Binary Oxide Resistive Memory (OxRRAM) for Post-NAND Storage Application," 2005 IEDM, Washington, DC, Dec. 5, 2005, pp. 750-753.

Hosoi et al., "High Speed Unipolar Switching Resistance RAM (RRAM) Technology," 2006 IEDM, San Francisco, CA, Dec. 11, 2006, pp. 1-4.

Kund et al., "Conductive Bridging RAM (CBRAM): An Emerging Non-Volatile Memory Technology Scalable to Sub 20nm," 2005 IEDM, Washington, DC, Dec. 5, 2005, pp. 754-757.

* cited by examiner put SE back in high-resistance state

CROSSPOINT ARRAY AND METHOD OF USE WITH A CROSSPOINT ARRAY HAVING CROSSBAR ELEMENTS HAVING A SOLID ELECTROLYTE MATERIAL USED AS A RECTIFIER WITH A SYMMETRIC OR SUBSTANTIALLY SYMMETRIC RESISTIVE MEMORY

RELATED APPLICATIONS

This application is a divisional of U.S. application Ser. No. 12/110,644, filed Apr. 28, 2008, pending, which is a continuation of U.S. application Ser. No. 11/679,785, filed Feb. 27, 2007, now U.S. Pat. No. 7,382,647.

BACKGROUND OF THE INVENTION

1. Field of Invention

The present invention relates generally to memory technology. More generally, it relates to the use of asymmetrically programmed high ON/OFF ratio memory materials and devices for use as diodes for driving symmetric or substantially symmetric resistive memory elements. More specifically, the present invention is related to a crosspoint array, and a method of use with a crosspoint array, having crossbar elements having a solid electrolyte material used as a rectifier with a symmetric or substantially symmetric resistive memory. In addition to addressing the new array architecture, device structures, material options, voltage sequences, etc. needed for using a solid electrolyte material for rectification of memory materials are described.

2. Discussion of Prior Art

The following references provide a general teaching of crosspoint arrays.

The U.S. patent to Hosotani et al. (U.S. Pat. No. 6,980,463) teaches a semiconductor memory device that has a structure using a rectifying element (e.g., a p-n junction diode) as a switching element connected to a Tunneling Magneto Resistive (TMR) element, wherein the described structure is a simple one capable of realizing a crosspoint cell.

The U.S. patent to Tsuneo Inaba (U.S. Pat. No. 7,046,546 B1) teaches a crosspoint memory cell with a memory device and a read switching element which may be a rectifying element.

The U.S. patent to Bozano et al. (U.S. Pat. No. 6,987,689 B2) teaches the possibility of achieving intrinsic rectification in a crosspoint memory element by the suitable choice of electrode materials.

The U.S. patent to Stasiak et al. (U.S. Pat. No. 7,034,332 B2) teaches a memory device including a substrate and multiple self-aligned nano-rectifying elements disposed over the substrate, wherein each nano-rectifying element has multiple first electrode lines, and multiple device structures are disposed on the multiple first electrode lines forming the multiple self-aligned nano-rectifying elements. According to Stasiak's design, the switching elements are made of phase change material.

The U.S. patent to Keiji Hosotani (U.S. Pat. No. 6,778,426 B2) teaches a magnetic random access memory (MRAM) using a phase change memory element instead of a tunneling magneto resistive (TMR) element.

The U.S. patent to Formigoni et al. (U.S. Pat. No. 4,795,657) teaches a memory cell with a rectifying element and a memory element.

The U.S. patent to Terry L. Gilton (U.S. Pat. No. 6,855,975 B2) teaches an integrated programmable conductor memory cell and diode device in an integrated circuit comprising a diode and a glass electrolyte element, the glass electrolyte element having metal ions mixed or dissolved therein and being able to selectively form a conductive pathway under the influence of an applied voltage. In one embodiment of Gilton's patent, both the diode and the memory cell comprise a chalcogenide glass, such as germanium selenide (e.g., $Ge_2Se_8$ or $Ge_{25}Se_{75}$). In this embodiment of the Gilton patent, the first diode element comprises a chalcogenide glass layer having a first conductivity type, the second diode element comprises a chalcogenide glass layer doped with an element such as bismuth and having a second conductivity type opposite to the first conductivity type, and the memory cell comprises a chalcogenide glass element with silver ions therein.

The U.S. patent to Frederick A. Perner (U.S. Pat. No. 7,042,757) provides a 1R1D block architecture magnetic memory device. The Perner reference relates to magnetic memory devices, and in particular, relates to cross-point resistive devices such as magnetic random access memory arrays (MRAMs). By incorporating PN diodes, the effective size of the cross-point array may be increased beyond the traditional 1,000 columns by 1,000 rows.

The U.S. patent to Perner et al. (U.S. Pat. No. 7,031,185) teaches a resistive cross point memory cell array comprising a plurality of word lines, a plurality of bit lines, a plurality of cross points formed by the word lines and the bit lines, and a plurality of memory cells, each of the memory cells being located at a different one of the cross points, wherein a first bit line comprises a distributed series diode along an entire length of the bit line such that each of the associated memory cells located along the first bit line is coupled between the distributed series diode and an associated word line.

The U.S. patent to Sharma et al. (U.S. Pat. No. 6,885,573) teaches a diode for use in MRAM devices and method of manufacture of such a device. Sharma et al. teach a data storage device that has a plurality of word lines, a plurality of bit lines, and a resistive crosspoint array of memory cells. Each memory cell is connected to a bit line and connected to an isolation diode that further connects to a respective word line. The isolation diode provides a unidirectional conductive path from the bit line to the word line. Each word line provides a common metal-semiconductor contact with each diode sharing the word line such that each diode has a separate metal contact located between the semiconductor portion of the common metal-semiconductor contact and its respective memory cell. Sharma et al.'s MRAM device has improved unidirectional elements to limit leakage current within the array.

The U.S. patent to Sharma et al. (U.S. Pat. No. 6,754,097) teaches magnetoresistive devices or memory elements of a phase-change material, which are connected as a crosspoint network, wherein blocking devices such as diodes or transistors may be connected to the magnetoresistive devices.

The U.S. patent to Lung Tran (U.S. Pat. No. 6,678,189) teaches memory cell elements which may include thin film memory elements such as polymer memory elements, magnetic tunnel junctions (the SDT junction is a type of magnetic tunnel junction), or phase change devices. Each memory cell is limited in providing a conductive path in a first direction only by way of a unidirectional element, wherein such unidirectional elements could have diodes.

The U.S. patent to Goodbread et al. (U.S. Pat. No. 6,670,824) teaches an integrated polysilicon fuse and diode and methods of making the same. The integrated polysilicon fuse and diode combination may be implemented in a programmable crosspoint fuse array. The integrated polysilicon fuse and diode may be used in a random access memory (RAM) cell.

The U.S. Pre-Grant Publication to Ferrant et al. (2006/0067112 A1) teaches resistive memory cells (which can be brought into two or more states exhibiting different electrical resistance values), such as magneto-resistive memory cells including magnetic tunnel junctions as used in conventional MRAMs, phase change memory cells using some sort of a phase change material, and conductive bridging memory cells using some sort of a solid state electrolyte in combination with an ion donor electrode using a independent-gated FINFET architecture.

Whatever the precise merits, features, and advantages of the above cited references, none of them achieves or fulfills the purposes of the present invention.

SUMMARY OF THE INVENTION

The present invention provides for a crosspoint array comprising: a plurality of bitlines and wordlines; and a plurality of crossbar elements, each crossbar element disposed between a bitline and a wordline, and each crossbar element comprising at least a solid electrolyte material used as a rectifier in series with a symmetric or substantially symmetric resistive memory, where one or more of the crossbar elements are responsive to the following voltages: a first set of voltages to transition the solid electrolyte in said crossbar elements from an OFF state to an ON state; a second set of voltages to read or program said symmetric resistive memory, and a third set of voltages to transition the solid electrolyte from an ON state to a OFF state.

The present invention also provides a method for use with a crosspoint array, with each crosspoint array comprising a plurality of bitlines and wordlines and a plurality of crossbar elements, and with each crossbar element disposed between a bitline and a wordline and with each crossbar element comprising at least a solid electrolyte material used as a rectifier in series with a symmetric or substantially symmetric resistive memory, the method comprising the steps of: applying a first set of voltages to at least one of said crossbar elements, the first set of voltages transitioning the solid electrolyte in said crossbar elements from an OFF state to an ON state; applying a second set of voltages to at least one of the crossbar elements, said second set of voltages reading or programming the symmetric resistive memory, and applying a third set of voltages to at least one of the crossbar elements, the third set of voltages transitioning solid electrolyte from an ON state to a OFF state.

In this context, an asymmetrically programmed memory material (also referred to as an asymmetric memory material) is defined as one that is programmed to a low resistance state when a bias of a particular polarity is applied and is programmed to a high resistance state when a bias of the opposite polarity is applied across it. In other words, the ON-to-OFF transition and the OFF-to-ON transition in such memory materials requires voltage of opposite polarities. An example of such a material is a solid electrolyte memory material.

Symmetric or substantially symmetric resistive memory elements can program to two different resistance values on the application of pulses of the same polarity but different magnitudes and pulse widths. In other words, the ON-to-OFF transition and the OFF-to-ON transition in these memory elements can be done with pulses with the same polarity. In addition, the symmetric or substantially symmetric nature of these elements requires that for each such transition (e.g., ON-to-OFF), voltage pulses of either polarity could be applied. In addition, these elements show substantially symmetric current-voltage characteristics about zero bias. The resistive memory elements may also exhibit threshold switching effects and may snap back from the high-resistance state to the low-resistance state.

DESCRIPTION OF THE PREFERRED EMBODIMENTS

Figure 1:
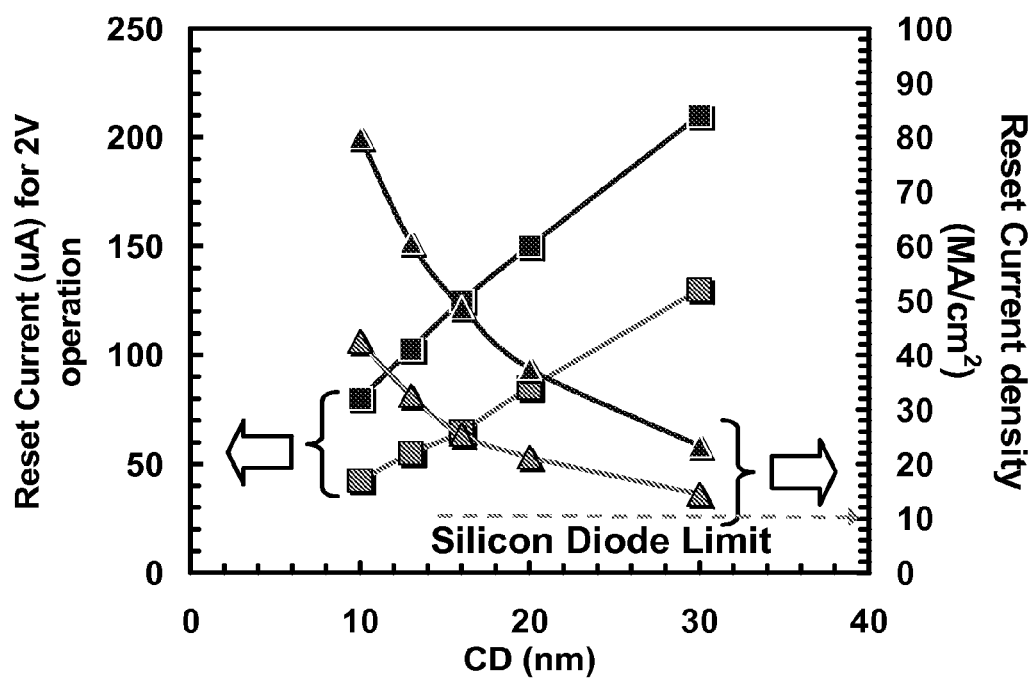
FIG. 1 illustrates the programming currents and current densities of typical resistive memory elements as a function of the critical dimension.

While this invention is illustrated and described with respect to preferred embodiments, the invention may be produced in many different configurations. There is depicted in the drawings, and will herein be described in detail, preferred embodiments of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

This present invention solves a very important problem related to ultra high density memory technologies. The densest form of memory technology that can be fabricated is a crossbar memory which is made of sets of perpendicularly oriented, lithographically defined conducting lines and a memory element and diode situated at the intersection of any 2 perpendicularly oriented lines. This density can be further increased by having many such layers of perpendicularly oriented lines in a 3D configuration or by having these perpendicular lines at sublithographic pitches (fabricated using nanoimprint lithography, for example). In any of these approaches, the memory element may be an element such as phase change memory, some form of magnetoresistive random access memory (MRAM), ferroelectric random access memory (FeRAM), organic resistive memory, complex metal oxide memories, oxide-resistive memories, perovskite memory, memories that change some electrical property when a current flows through them, etc.

Most memory elements including the ones listed above need very high current densities for programming—especially as the memory element is shrunk down to deep submicron dimensions. The major function of the diode (in series with the memory element at the crosspoint) is to turn off all the other memory elements in the array—so that these elements don't interfere with the program/read/erase (P/R/E) operation of the selected memory element. In addition, the diode has to be able to supply enough current required by the memory element for its P/R/E operation. Typical current densities required for these memory elements range from $10^6$ to $10^8$ A/cm$^2$. The best known silicon p-n junctions can supply currents with not much higher than $10^6$ A/cm$^2$ densities at reasonable voltages (the current density in polycrystalline p-n junctions is even lower). This raises the need for a new diode element that can be used with bi-directional memory elements, such as the ones listed above and which can supply ultra-high current densities.

The present invention uses an asymmetrical resistive memory material such as a solid electrolyte material as a diode for driving symmetric or substantially symmetric resistive memory elements (henceforth referred to as MEM). As will be described later, a solid electrolyte element (SE) has very high resistance in the OFF state and a very low resistance in the ON state (because it has a metallic filament bridging the two electrodes in the ON state). These attributes make it a nearly ideal diode. During the passage of current (during program/read/erase) of the memory element, the solid electrolyte material also programs into the low resistance state. In order for the diode functionality to work, the final state of the solid electrolyte material must be the high resistance state. Therefore each P/R/E operation of the MEM has to be followed by erasure of the solid electrolyte element. This can be accomplished using one of the following:

(a) Redesigning the solid electrolyte to trade off retention for erase speed—in this case, if the retention of the solid electrolyte is poor, no erasure of the solid electrolyte is required or a very low voltage erase would suffice.

(b) Thermally redesigning the device so that during Reset and/or Set, the temperature in the device is approximately >100° C. or so—this should accelerate the erasure process. This can be combined with both (a) and (c)

(c) Erase the SE by applying a sequence of pulses—and ensuring that the SE erasure step does not inadvertently end up programming or erasing (or in general changing the state of) the MEM element. Alternately, the memory element could be put in the final desired resistance state during the SE erasure step.

The present invention teaches the use of asymmetrical memory material such as a solid electrolyte (SE) resistive memory element in a crosspoint memory architecture. The present invention addresses some of the possible device structure options and some of the possible voltage sequences for successful array operation. The present invention also addresses possible array configurations.

Examples of SE memory material include, but are not limited to: germanium sulfide ($Ge_xS_{1-x}$), germanium selenide ($Ge_xSe_{1-x}$), germanium telluride ($Ge_xTe_{1-x}$), silicon sulfide ($Si_xS_{1-x}$), silicon selenide ($Si_xSe_{1-x}$), silicon telluride ($Si_xTe_{1-x}$), arsenic sulfide ($As_xS_{1-x}$), arsenic selenide ($As_xSe_{1-x}$), arsenic telluride ($As_xTe_{1-x}$), lead sulfide ($Pb_xS_{1-x}$), lead selenide ($Pb_xSe_{1-x}$), lead telluride ($Pb_xTe_{1-x}$), cadmium sulfide ($Cd_xS_{1-x}$), cadmium selenide ($Cd_xSe_{1-x}$), cadmium telluride ($Cd_xTe_{1-x}$), zinc sulfide ($Zn_xS_{1-x}$), zinc selenide ($Zn_xSe_{1-x}$), zinc telluride ($Zn_xTe_{1-x}$), silver sulfide ($Ag_xS$), silver selenide ($Ag_xSe$), copper sulfide ($Cu_xS$), copper selenide ($Cu_xSe$), tungsten oxide ($WO_x$), copper oxide ($Cu_xO$), silver (Ag), copper (Cu), lithium (Li), sodium (Na), and zinc (Zn).

Although throughout the specification, a generic symmetric memory technology has been used as an example, it should be noted that the teachings of the present invention can also be applied in other cases pertaining to substantially symmetric memory elements and in applications such as, but not limited to, Field Programmable Gate Array (FPGA), embedded microcontrollers, hard-disk drives, and devices for space-applications.

In order to increase the density of memory technologies (both volatile and nonvolatile), a crosspoint design is preferred. In such an optimized design, the wordline and bitlines (henceforth referred to as memory lines) run at minimum possible pitch. A storage element is placed at the sandwich of these perpendicularly oriented lines. Two possible designs exist:

(a) A Nano-Crossbar Design—where the memory lines run at sublithographic pitches. This decreases memory cell area from $4F^2$ to $4Fs^2$ where 2Fs is the nanoscale pitch. Typically Fs<<F where 2F is the lithographic pitch.

(b) A 3D Design—where the memory lines run at lithographic pitches but multiple layers of these memories are formed. The effective density of these cells is therefore $4F^2/n$ where n is the number of 3D layers (n>=1).

In both cases above, at the intersection of the memory lines, two device components are needed:
(a) A memory element that is used to store data/information. Many options exist here and include most resistive memory elements.
(b) Since a transistor is not present at every crosspoint, a selection device is needed that shows rectification properties or, in general, exhibits non-linearity. This ensures that cells that lie on unselected wordlines and bitlines are not inadvertently programmed or shorted to each other.

For most promising memory materials, programming current densities that are of the order of $10^7$-$10^8$ A/cm$^2$ are needed for critical dimensions (CDs) down in the range of 20-40 nm. FIG. 1 illustrates a graph of reset current and reset current density versus critical dimension for resistive memory elements that controllably change phase upon the passage of current. It can be seen from FIG. 1 that currents reduce with scaling but current densities increase substantially due to thermal losses that increase with scaling.

The best known single-crystal silicon p-n and Schottky diodes that can be used for rectification provide current densities not much higher than $10^6$ A/cm$^2$ at low voltages. This limit comes from a number of different factors including high level injection effects in p-n junctions, series resistance of doped region(s), etc. This is an order of magnitude smaller than what is needed for most resistive memory elements. In addition, the quality of the diodes that can be fabricated in middle-of-line (MOL) or back-of-end-the-line (BEOL) processes are typically much worse since they have to be made in amorphous or polycrystalline silicon that has much lower mobility. This prevents the use of p-n junctions in silicon or other materials as a rectifier for high-current memory elements (especially in 3D).

In addition, the current through unselected cells has to be small to prevent array-disturbs and reduce programming power. Typically a rectification ratio well in excess of 10 times the number of elements on the WL or BL is needed. In other words, for typical Mbit arrays, a rectification ratio of 10000 or above is needed (preferably exceeding $10^7$). The rectification ratio is typically a function of the bias since the leakage is typically a function of bias.

The prior art is silent with respect to solving any of the above-mentioned problems.

Since no conventional p-n junction in silicon and polycrystalline can supply enough current density for most resistive memory materials, other nonlinear elements may be considered for use as diodes. For picking such a material, there are two important criteria:
(a) The ON state must have very high current densities—this can be largely achieved by using a metal for conduction.
(b) The OFF state must have a very high resistance. The ON/OFF ratio is preferably at least $10^6$ or so—so that reasonable array sizes may be enabled.

In one non-limiting example, the OFF state current density is less than 100 A/cm$^2$. In another non-limiting example, the OFF state current density should be less than 0.1 A/cm$^2$. More often than not, for array operation, it's the ON/OFF ratio that matters and an ON/OFF ratio exceeding $10^4$, and preferably exceeding $10^6$, is ideal.

The use of a metallic filament for conduction to program or read or erase typical resistive memory elements is introduced. However, in order to get rectification, it is important to have the metallic filament disappear in the OFF state. Such a material exists in the form of Solid Electrolyte (SE) memory.

The present invention teaches the use of SE materials, not for use as a memory, but as a rectifier in a crossbar array.

The paper to Kund et al. titled "Conductive bridging RAM (CBRAM): An emerging non-volatile memory technology scalable to sub 20 nm". Kund et al., in the paper, report on the electrical characterization of nanoscale conductive bridging memory cells, composed of a thin solid state electrolyte layer sandwiched between an oxidizable anode and an inert cathode. Kund et al. disclose CBRAM nanoscale memory devices with memory characteristics based on resistive switching at very low voltage with high $R_{off}/R_{on}$ ratios. However, it is important to re-emphasize that the Kund et al. paper does not teach or suggest the use of SEs as a rectifier in a crossbar array.

Typical materials used for SE materials include (but are not limited to):
(a) Pure binary chalcogenides—$Cu_xS$, $Ag_xS$, etc.
(b) Ternary chalcogenides—Ag/Cu/Zn/Li/Na, etc. doped binary chalcogenides (selenides, sulfides, tellurides of silicon, germanium, antimony, arsenic)
(c) Quaternary chalcogenides—Ag/Cu/Zn/Li doped ternary chalcogenides (for example —Ge—Sb—S)
(d) Binary metal oxides—(for example, $WO_3$, $SiO_x$)

An SE element typically consists of one or more of the aforementioned SE materials sandwiched between 2 electrodes. Typically one of the electrodes is made up of an inert material (e.g., W, TiN, etc.) and the other electrode is oxidizable (e.g., Ag, Cu, etc.) although this is not a necessary requirement.

Examples of electrode material include, but are not limited to: copper (Cu), silver (Ag), zinc (Zn), lithium (Li), sodium (Na), aluminum (Al), tungsten (W), titanium (Ti), titanium-tungsten ($Ti_xW_y$), tantalum-tungsten ($Ta_xW_y$), titanium nitride ($Ti_xN_y$), tantalum (Ta), tantalum nitride ($Ta_xN_y$), titanium silicon nitride ($Ti_xSi_yN_z$), tantalum silicon nitride ($Ta_xSi_yN_z$), silver sulfide ($Ag_xS$), silver selenide ($Ag_xSe$), silver-copper alloy, copper sulfide ($Cu_xS$), and copper selenide ($Cu_xSe$).

Basic characteristics of a solid electrolyte memory include—
turning ON at small positive biases (typically 0.1 to 0.5V)—converts the memory from an ultra high resistance OFF state to a low resistance ON state. The value of the bias depends on the solid electrolyte material and the electrode material.
turning OFF at small negative biases (typically −0.1 to −0.5V)—converts the memory from an ultra low resistance ON state to a high resistance OFF state.

One of the major issues with an SE Memory is retention. This can be a problem for storing data in non-volatile memory (NVM). On the other hand, using SE as a rectifier does not require the SE memory to retain data.

The present invention, therefore, discloses an array architecture, possible device structures, voltage sequences and possibilities for using solid electrolyte materials and structures for rectification of most resistive memory materials. The information below also explores programming speeds, array organization, disturbs, endurance, etc. of a memory stack comprising MEM as an exemplary memory node (material) and Solid Electrolyte as a rectifying element.

It should be noted that while two specific memory elements have been shown as examples, the teachings of the present invention are very broad and can be applied to a host of memory node and rectifying elements as long as certain criteria are met.

Figure 2A:
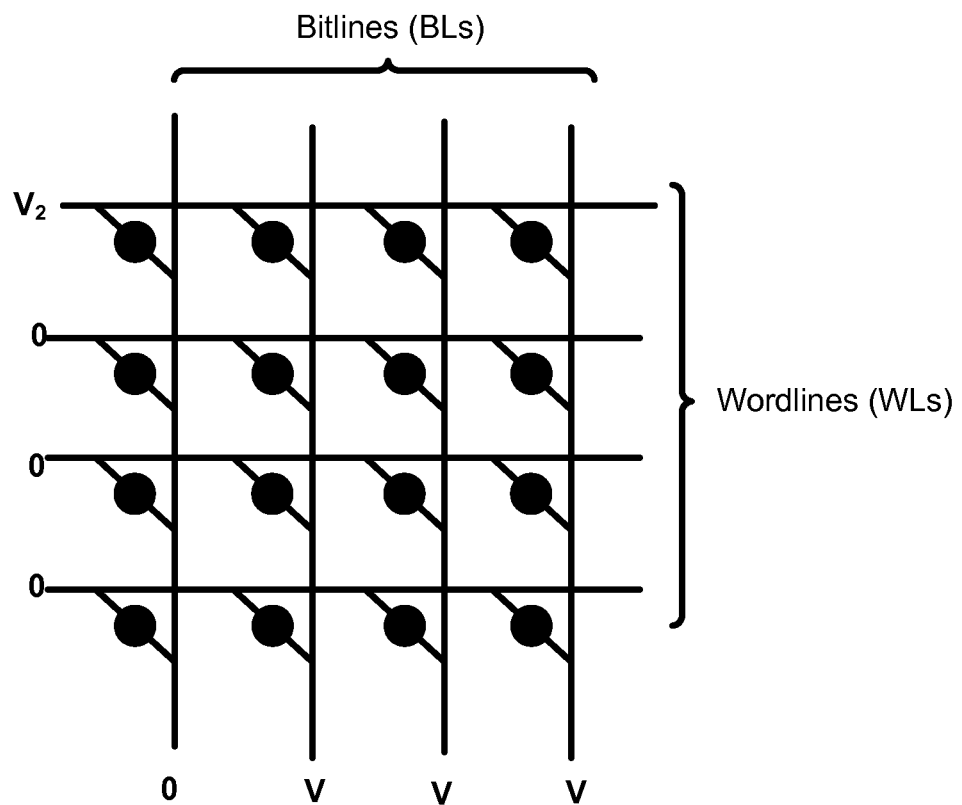
FIG. 2a illustrates a schematic plan view of one embodiment of the crossbar array wherein the selected wordline (WL) is at $V_2$, the selected bitline(s) (BL) is at 0V (Row 1 Column 1), the unselected wordlines are at 0V and the unselected bitlines are at V.

I. SE as a DIODE for Other Memories—Full-Select Mode (FSM) Architecture:

A rectifying element that turns on strongly at positive bias and switches off at negative bias work would in an FSM crosspoint architecture. FIG. 2a illustrates example voltages for an FSM crosspoint architecture for Program/Erase according to the teachings of the present invention. Each circular element in the figure represents a combination of a rectifying element (RE) and a memory element (ME). In an FSM architecture, the rectifying elements need to be shut off at negative bias or at weak positive bias.

Figure 2B:
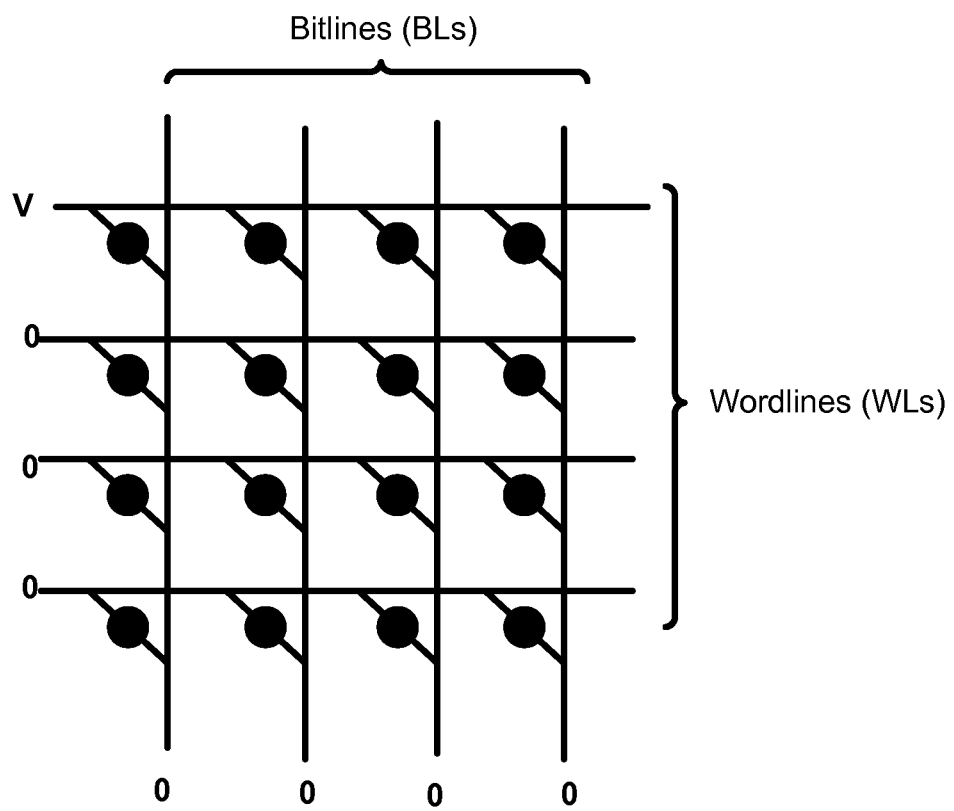
FIG. 2b illustrates an example of a full select memory (FSM) array during a read operation.

In one embodiment, as shown in FIG. 2a (and FIGS. 5a-c and 6a-d), the selected WL is at $V_2$ and the selected bitline(s) is at 0V (Row 1, Column 1 in FIG. 2a). In FIG. 2a, all unselected wordlines are at 0 and all unselected bitlines are at V. There are many possible choices of voltages (depending on the characteristics of the rectifier and the memory material), but this is one possible embodiment. The unselected wordlines are at 0 volts, and the unselected bitlines are at V volts. It should be emphasized that the voltages shown in FIGS. 2a-b are for illustration purposes only, as the unselected bitlines can be at any potential that will prevent the diodes at the intersection of rows (2,3,4) and columns (2,3,4) from turning on within the time required to typically program/read/erase the selected memory element. So any small positive bias or any negative bias would be acceptable. In this particular example, the disadvantage is that all bitlines should be pulled up to V volts. However, this might not be an issue for volatile and nonvolatile technologies where power dissipation is dominated by memory cell power dissipation—and is not determined by the power required to charge or discharge the bitline or wordline capacitance. The wordline and bitline circuits are driven by wordline decoders and drivers and/or column selects and sense amplifiers. These circuits are not shown and can be placed on the periphery of the array and/or below the array in a 3D circuit. It should be noted that the preferred set of voltages in an FSM architecture is one that applies a positive voltage to the programmed element(s) and zero or negative voltages to all unselected elements. The requirement therefore is that the rectifying element should shut off at zero and/or negative biases. This architecture is preferred for the rectifying element that forms the basis for this disclosure although other array architectures with different potentials on the selected and unselected wordlines and bitlines may be employed.

An exemplary sequence for this example is:
All bitlines (BLs) are pulled from 0 to V.
A selected wordline (WL) goes from 0 to $V_2$.
Selected BL(s) go from V to 0. This causes the memory array's BL and WL potentials to look like the potentials shown in FIG. 2a. This allows for the selected memory elements to be programmed. It should be noted that this may also involve sequentially programming memory elements, which can involve selected BLs changing from V to 0 and then back to V.
Selected BL is pulled back to V.
Selected WL is grounded followed by all BLs being pulled back to ground, and this may be repeated.

In this example, the leakage through each unselected element should satisfy the condition $$\text{programming or read current } I \gg (M-1) \times (M-1) \times ICE(-V)$$

where ICE(−V) is the crossbar element (comprising a Memory Element (ME)+Rectifying Element (RE)) current at −V, which is cut off by the rectifying element.

FIG. 2b illustrates an example of an FSM array during a read operation. During an FSM Read, the selected WL is at V and the selected BLs (where data are read out) can be at 0V (unselected BLs, not shown in the Figure, can be at V or higher). The memory elements on the selected WL and BL=0V will cause bitline potentials to rise (if they have low resistance). The sense amplifiers detect the state of the cell, and consequently WL can be driven to 0 and all unselected BLs to 0V.

It should be noted that FIGS. 2a-b and the associated descriptions are illustrative examples based on an ideal crossbar element that involves a diode element that does not program during the program/erase/read operation of the cell, which is not necessarily required.

Figure 3:
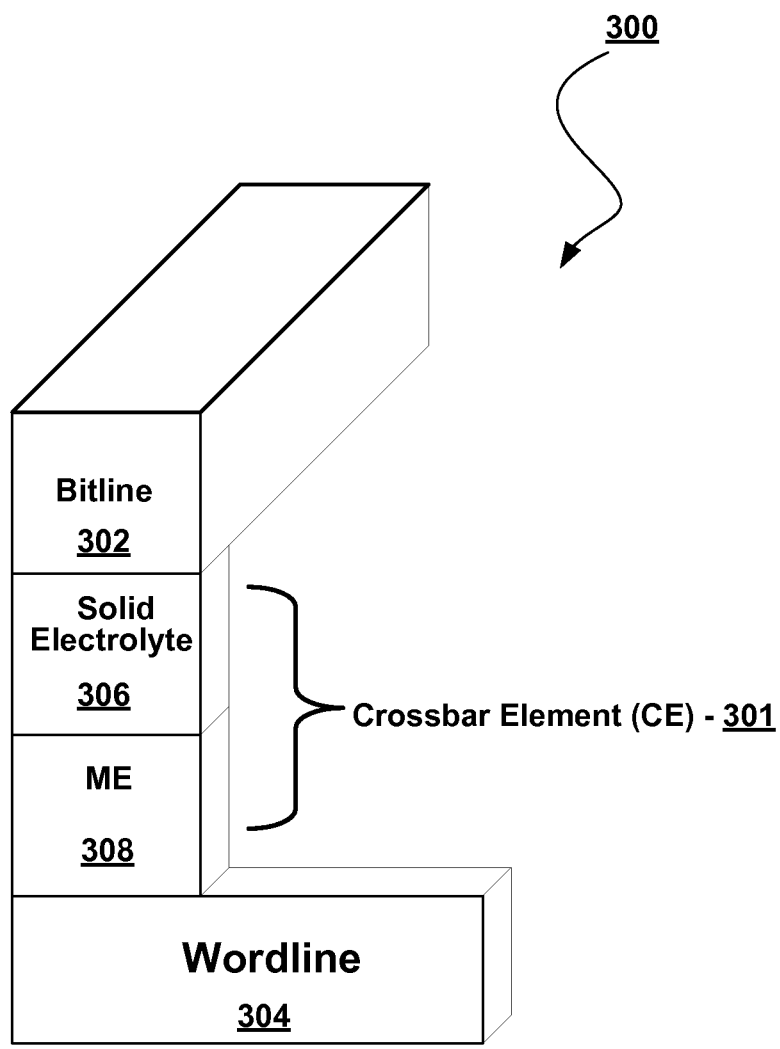
FIG. 3 illustrates a simplified crossbar element (CE) comprising an asymmetrically programmed memory material (SE) and a substantially symmetric memory material (ME) sandwiched between a bitline and a wordline.

II. Solid Electrolyte as a Diode for Symmetric Resistive Memories:

FIG. 3 illustrates a preferred embodiment 300 of the present invention. FIG. 3 illustrates a crossbar element (CE) 301 sandwiched between bitline 302 and wordline 304. The dimensions of elements shown in FIG. 3 may be in the range of 5 nm to 500 nm. The CE comprises a memory material (ME) and a rectifier element (RE). The RE is shown as a solid electrolyte element although other asymmetric memory materials may also be used. This schematic is meant to illustrate the series stack between the wordlines and bitlines. Cross bar element 308 further comprises an asymmetrically programmed memory material such as a solid electrolyte material 306 (a non-exhaustive list of which was provided earlier) in series with at least one memory element 301. Memory element 308 should be substantially symmetric and in general could be a purely resistive memory element. This series stack is placed between 2 electrodes (e.g., bitline 302 and wordline 304)—which could be the 2 perpendicular lines that form the crossbar array. As described earlier, certain resistive memory elements could snap back from the high resistance state to the low resistance state. In this scheme, it is also envisioned to include additional elements in series such as series resistors that can be used to "ease snap back". The series resistors could be made either in the memory material or in a material having reasonable resistance like $Ti_xN_y$, $Ta_xN_y$, $Ta_xSi_yN_z$, $Ti_xSi_yN_z$, amorphous or polycrystalline silicon or silicides. In addition, although regions 306 and 308 have been shown to be next to each other, in some cases it might be advantageous to place a barrier layer (W or TiN or any other semiconductor or metal) between the 2 electrodes for thermal insulation.

A symmetric resistive memory element herein is an element that shows similar or symmetric current voltage characteristics (including programming and erasing conditions) about zero applied bias across the device. Such an element need not show purely linear characteristics. For example, such a device could be programmed with either positive or negative voltage of similar amplitudes Also, a substantially symmetric resistive memory element herein is an element that shows dissimilar or not-completely symmetric current voltage characteristics about zero applied bias. Such an element need not show purely linear characteristics either. In such a memory element, the program and erase operations do not require opposite voltage polarities (which an asymmetric programmed memory material requires) across the device but have different amplitudes. Also, the same set of operations (program or erase) may be carried out in either voltage direction but with different amplitudes and currents.

An asymmetrically programmed memory element is an element that requires opposite voltage polarities for the program and erase operation. A solid electrolyte memory element is an example of an asymmetrically programmed memory element.

For the purposes of discussion (and convenience), let us assume that the memory element is a simple resistive and symmetric or substantially symmetric memory element (referred to as MEM) that exhibits 2 different resistance states.

The lower resistance state is obtained by applying a lower amplitude voltage (typically 1-2V) for a longer period of time (~100 ns-100 µs), and the higher resistance state is obtained by applying a higher voltage for a shorter period of time (typically 1 ns-1 µs). In addition, MEM may exhibit snap back effects—which are not discussed in detail here. A similar analysis (albeit with minor changes) could also be applied to any other resistive memory element. In much the same way, even though an SE material has been used for illustration as the diode, other asymmetrically programmed memory materials may work.

Figure 4:
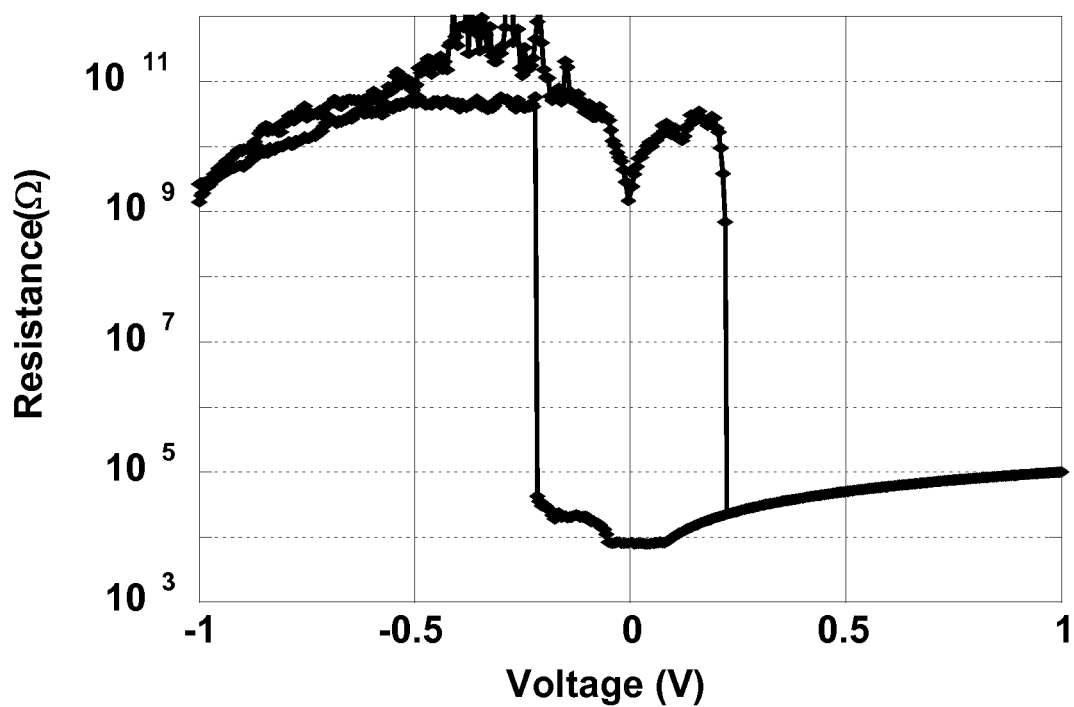
FIG. 4 illustrates a graph of the Solid Electrolyte (SE) resistance versus the voltage, from which it can be seen that the SE, on application of a positive voltage switches from high resistance to low resistance and, in application of a negative voltage switches from low resistance to high resistance.

III. Basic Operation of MEM and SE:

FIG. 4 illustrates a graph of the SE resistance versus the voltage, from which it can be seen that the SE, on application of a positive voltage, programs to the low resistance state and, in application of a negative voltage, programs to the high resistance. The two curves in FIG. 4 represent a forward sweep from −1.0 to 1.0 and a reverse sweep from 1.0 to −1.0, respectively. Let us assume that the SE is initially in the high resistance state, i.e., with no metallic filament that connects its two electrodes. In general, the solid electrolyte turns ON at a positive voltage ($V_A$) and turns OFF at a negative voltage ($-V_B$). $V_A$ and $V_B$ are a function of the material, temperature, measurement conditions, etc. When the SE turns ON, the ON resistance is typically a function of the program current ($R_{ON}=V_{th}/I_{PROG}$) where $V_{th}$ is the electro-deposition threshold. The OFF resistance is a function of the solid electrolyte material, the inert electrode, and other factors including temperature. $V_E$ is defined as the voltage at which the SE completely switches OFF for <a specified time period ($T_E$). $V_E$ is different from $V_B$ in the sense that $V_B$ is its DC equivalent. Also, $V_{EM}$ refers to the most negative $V_E$ that would guarantee a <50 ns turnoff speed for the entire array.

For the MEM, let us assume that the threshold of switching (from OFF to ON) is $V_T$. Furthermore, MEM switches to its low resistance when V (across MEM)=$V_S$ and I (MEM)=$I_S$ for a time=$t_S$. Also, it switches to the high resistance state, when V (across MEM)=$V_R$ and I(MEM)=$I_R$ for a time=$t_R$. An assumption is made that MEM is substantially symmetric—both positive and negative voltages can cause switching in a symmetric device.

It will be shown that with this stack, it is possible to program, read, and erase the MEM element and at the end of the operation, it is possible to put the SE back into the high resistance state for the next array operation.

As will be seen (the MEM+SE crosspoint architecture) has 3 major operations which might comprise a sequence of voltages applied across the device:

(a) Convert the SE from the high resistance OFF state to the low resistance ON state.
(b) Program(Set)/Read/Erase(Reset) the resistive memory element (MEM). In one embodiment, operations (a) and (b) happen with one set of pulses.
(c) Erase the SE from the low resistance ON state to the high resistance OFF state. For MEM erase or reset operations, (a), (b) and (c) can be combined. Note that an SE erasure step may not be necessary if the retention of the SE device is poor, i.e., $T_{retention}$<time between steps (b) and (c).

Operations (a) and (b) are straightforward but operation (c) is complicated by the fact that the SE needs to be erased without disturbing the data stored in MEM. This is because after (a) and (b), the SE is in the low resistance state. In order to erase the SE, a negative voltage is applied, which causes a current to flow in the MEM+SE. The amount of current that flows through the MEM+SE is a function of the ON resistance of the MEM and SE after operations (a) and (b). Alternately, it might be advantageous to put the MEM in the desired state in operation (c).

Since negative current flows in the MEM during operation (c), a lot depends on the ratio $M=V_E/V_{th}$ of the solid electrolyte element (assuming that the retention of the SE device is good).

Operation (c) may not be necessary if the following hold:
(a) The SE retention is poor—or the device structure is engineered such that SE retention is poor. This will allow the SE to get back into the high resistance state without an explicit SE erase operation.
(b) The SE retention is poor at higher temperatures (>100° C.). This might make erasure unnecessary during SET and RESET operations of the resistive memory if thermal effects in the MEM or SE cause a temperature increase.

For the purposes of discussion, we will discuss the complicated case where it is assumed that operations (a), (b) and (c) are required. However, it should be noted that if (c) is not required, it only makes the overall architecture simpler since the MEM state will not be disturbed during the SE erasure step.

IV. READ:

Let us begin with the read operation. A typical read operation can take 50 ns or so (especially if the array is big and the sense amplifiers are small and at tight pitches) although times as large as 10-100 µs might be acceptable. A couple of (reasonable) assumptions are made for the read operation:

(a) The read operation occurs on a time scale so that the SE is in the steady-state condition (i.e., V across the solid electrolyte is $V_{th}$), however, it should be noted that this is not a necessary condition.
(b) The current flowing in the system is low and there is no temperature rise anywhere in the system. This is good because it creates a simple case when everything is at room temperature.

It should be noted that the functionality of the array architecture is not dependent on these assumptions but they have been made for convenience of illustration.

After operations (a) and (b), the SE is in the low resistance state with one of the following resistances:

$$R_{ON(SE)}(\text{MEM in SET})=V_{Read}*R_{MEM(S)}/V_{th}$$

$$R_{ON(SE)}(\text{MEM in RESET})=V_{Read}*R_{MEM(R)}/V_{th}$$

where $R_{ON(SE)}$(MEM in SET) refers to resistance while MEM is in a SET state, $R_{ON(SE)}$(MEM in Reset) is the resistance when MEM is in a RESET state, $V_{Read}$ refers to the voltage across the MEM during the Read operation and $R_{MEM(S/R)}$ denotes the resistances of the MEM in the SET and RESET state, respectively. The SE needs to be in the linear region even when the MEM being read is in the high resistance state (for example—this can be a problem if the filament is thinner than a monolayer, but MEM OFF resistance engineering can solve this problem by ensuring that the MEM OFF or RESET resistance is not excessively high.

In order to erase the SE (Operation—c), a negative voltage is applied across the MEM-SE, so that the voltage across it is $-V_{EM}$. The voltage across the MEM during this state is $$V_{MEM(C)}=-V_{READ}*(V_{EM}/V_{th})$$

where $V_{READ}$ is the voltage across MEM during read operation (b) and $V_{th}$ is the electro-deposition threshold at room temperature. A lower voltage can also be applied to erase slowly.

It needs to be ensured that $V_{MEM(C)}$ is $<V_{SET}$ for all bits in the memory array. Normally a $V_{MEM(C)}$ of <0.5-0.8V should be able to satisfy this condition.

From the above equation, if $V_{EM}<V_{th}$, then it is not a problem since the device will not be inadvertently SET during the step (c)→SE erase. The case that needs the most scrutiny is what happens if $V_{MEM}>V_{th}$. In this particular case, a $V_{read}$ is chosen that would result in an effective $V_{MEM(C)}$ that is <Vset(min) for the entire array. This might lower the read margins a little bit, but this can be compensated for by increasing the read-time. In other words, the following case applies:

$$V_{READ}<V_{SET(min)}*V_{th}/V_{EM}$$

This tells us that it would be advantageous to push $V_{SET}$ up to 1.0V or, in order to maximize the voltage range between SET and READ, and thus account for variations in the memory element and SE memory materials. The actual read operation for the array is summarized next.

For each array, the number of bits that can be read is a function of the wordline and bitline current driving capability (at the read voltage) and the application. Since the wordline and bitline drivers have the capability to drive at least current=$I_{reset}$, and $I_{reset}$ is typically 5-10× of $I_{read}$, at least 10 or 8 bits can be easily read in one operation.

Figure 5C:
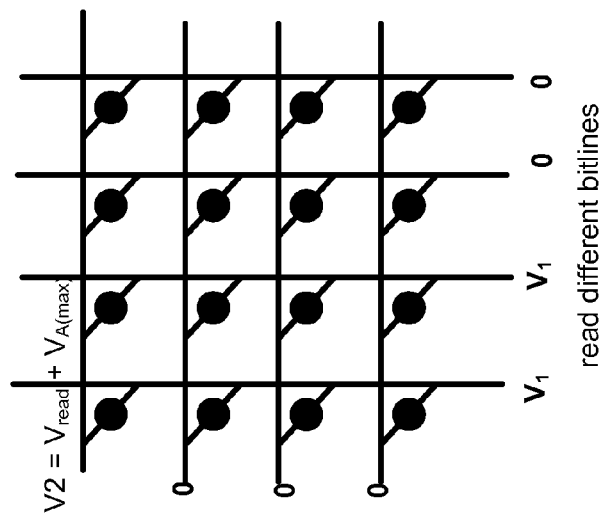
FIGS. 5a-c illustrate the read operation according to one embodiment of the present invention using one possible array voltage sequence for memory elements (MEM)+SE array configuration.
Figure 5B:
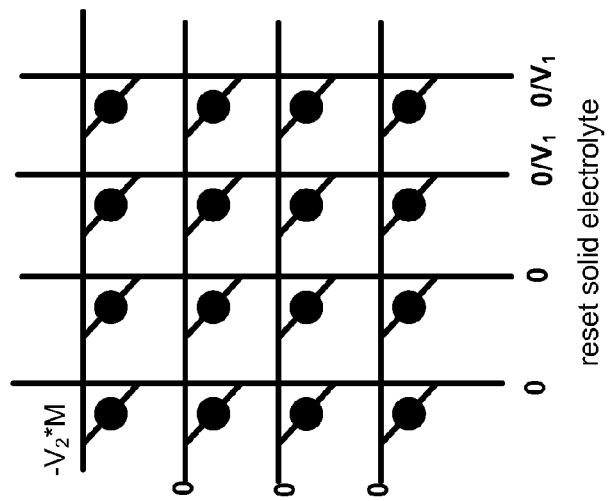
Figure 5A:
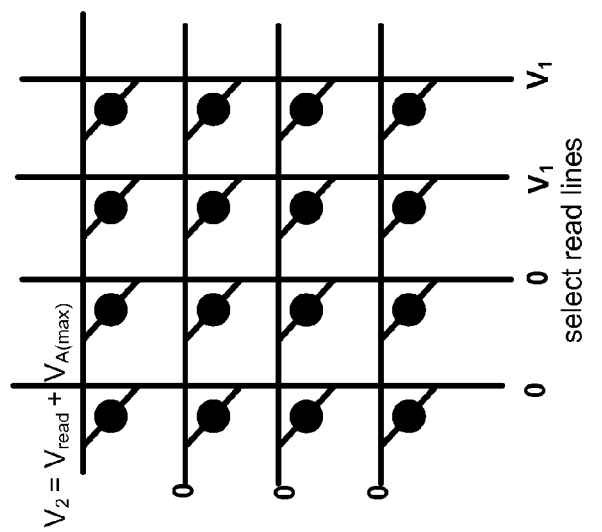

IVa. Read Operation—Scheme 1:

FIGS. 5a-c illustrate one implementation of the read operation (referred to as Scheme 1) using one possible array voltage sequence for the MEM+SE array configuration. In this and subsequent figures, M refers to the multiplying factor that will cause enough of a voltage drop to ensure erasure of the slowest SE element in the array. M could have any value from 0.05 to 5 and depends on a number of factors including the electro-deposition threshold, erase threshold, retention properties of the solid electrolyte material, the characteristics of the memory material, and the variability in the memory array. In FIG. 5a, a total voltage $V_2$ is applied that is >0.5V and >$V_A$ on the selected WL. All unselected WLs can be at 0. All to-be-read BLs can be initially pre-discharged down to ground. All unselected bitlines are at $V_1$ which can be either=$V_2$ or $V_2+\Delta2$, where $\Delta2$ is the negative bias across half-select WLs and BLs (for margin). This is just one exemplary sequence (since the array operation may work even with a low positive voltage across the half-selected WL and BL elements; for example, here one could take advantage of the fact that the turn-on time of the solid electrolyte material is an exponential function of bias). In the top left of the memory array, the elements at the intersection of the top WL and the left two bitlines are read and the corresponding bitlines either stay at ground or get pulled up because of low resistance. Then, as shown in FIG. 5b, a negative voltage is applied to a selected wordline. All the bitlines are grounded or at some positive voltage (say $V_1$). The negative voltage erases the SE element. FIG. 5c illustrates the sequence for the next read operation.

This is one possible embodiment of the overall read operation, although all the bitlines are driven to ground during SE erase, in order to prevent excessive voltage across the half-select devices. This means that the bitline charging/discharging power can be rather large for this scheme. An alternate scheme is shown below that should work equally well.

Figure 6A:
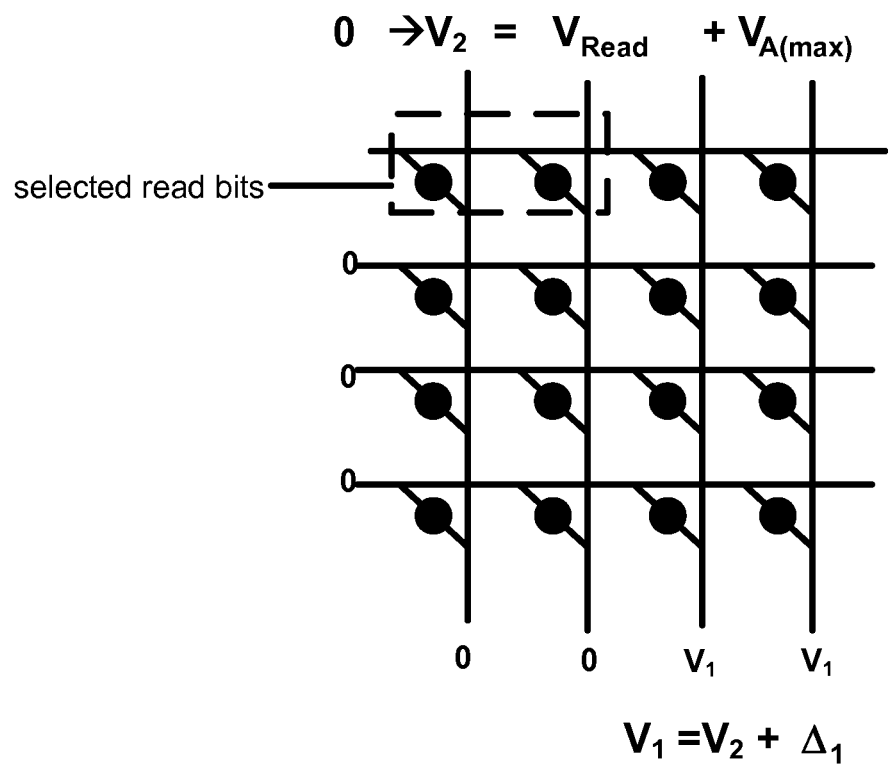
FIGS. 6a-d illustrate the read operation according to another embodiment of the present invention.

IVb. Read Operation—Scheme 2:

FIGS. 6a-d illustrate another implementation of the read operation (referred to as Scheme 2). FIG. 6a illustrates part 1 of the read operation of Scheme 2. This is similar to what was described before. A selected WL is at $V_2$, unselected WLs are at 0, unselected BLs are at $V_1$ and the selected BLs are pre-discharged to ground. As was the case before, if MEM is in the SET state, the BL potential is pulled up and the BL potential stays at ground if MEM is in the RESET state. The conditions on V and $V_1$ are similar to what was described in Scheme 1.

Figure 6B:
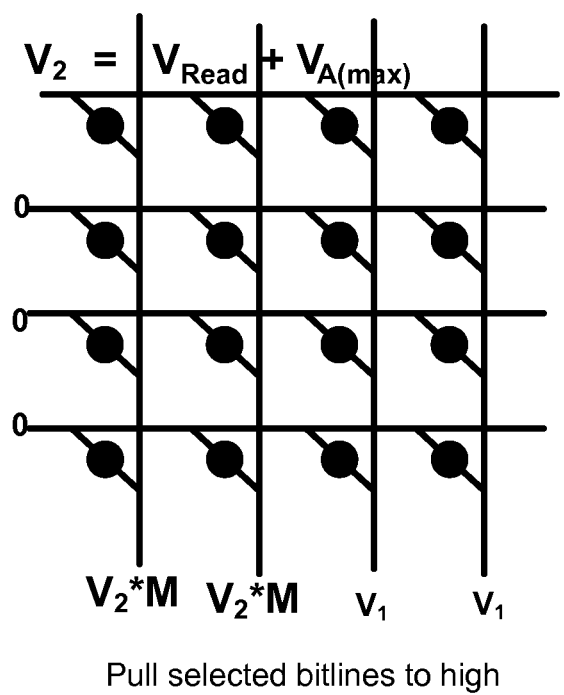

FIG. 6b illustrates part 2 of the read operation of Scheme 2. With the WL voltage at $V_2$, the "originally selected" bitlines are pulled to $V_2*M$ where M is a predetermined quantity that in one particular example may be based on max($V_{EM}/V_{th}$). M is in the range of 0.05 to 5.0. It should be noted that the magnitude of the maximum negative voltage across unselected elements on selected bitlines is $V_2*M$; other voltages don't change. One may wait until unselected WLs get back to 0V (from coupling from selected BLs).

Figure 6C:
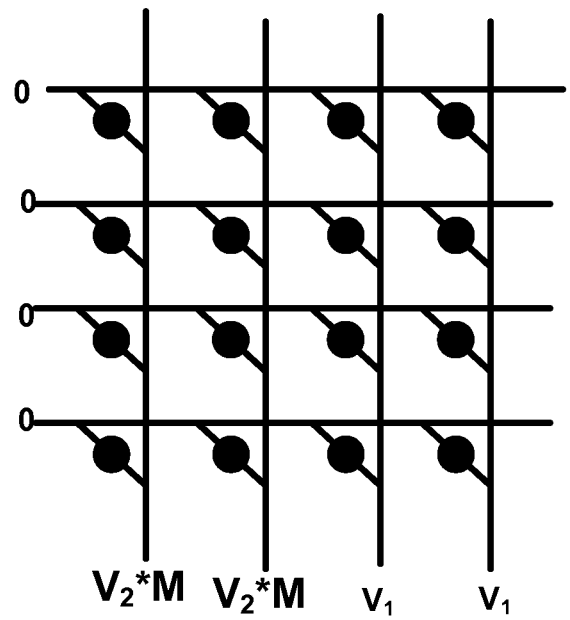

FIG. 6c illustrates part 3 of the read operation of Scheme 2. With the BLs at $V_2*M$, the selected WL is pulled to 0V. This will cause a voltage=$-V_2*M$ to appear across the MEM+SE elements that were just read. Other elements across unselected bitlines have $-V_1$ across it. The maximum voltage across MEM=$M*V_2-V(E,MIN)$, (where V(E,MIN) is the minimum erase threshold of the rectifier element for the array); it is made sure that this is less than threshold for SET of MEM. This causes an erase on the solid electrolyte elements while making sure that MEM is not accidentally SET. As long as the conditions in Scheme 1 are met, the conditions here are satisfied too. In addition, the maximum negative voltage across the MEM+SE stack is lower than that in scheme 1.

Figure 6D:
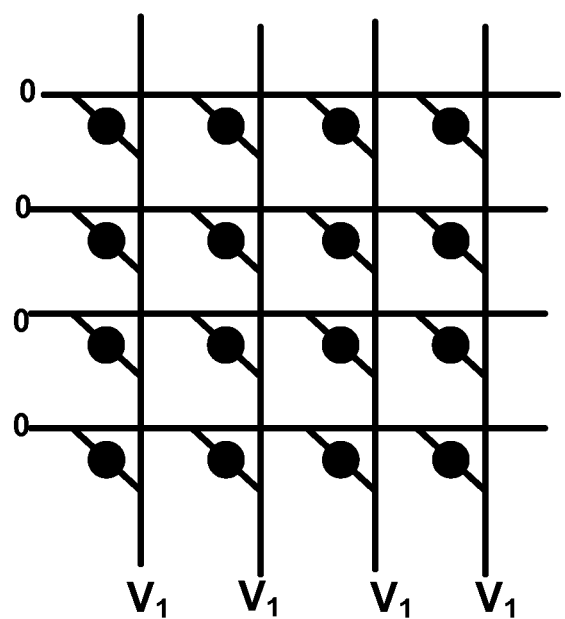

FIG. 6d illustrates part 4 of the read operation of Scheme 2. If the SEs have been erased, the "selected" BLs are pulled back to $V_1$. At this point the array looks very similar to the first step and one of the following occurs:

(a) reactivate the wordline (WL) to program other bits on the same WL

OR (b) activate other WLs to read other bits.

It should be noted that Scheme 2 is preferable over Scheme 1 since it calls for a lesser voltage across the most negatively biased SE element, which puts lesser demands on the rectification ratio of the SE.

Many other voltage sequences are possible for reading the memory element and depend on the characteristics of the memory material and the rectifier material. In general, it is desired that the voltage across the selected ME+RE material stack turn the RE on in a reasonable period of time T (typically <10 μs or so), while the bias across the half-select and unselected elements is such that the RE stays off in this time period. Note that this may be possible with low positive voltages across the half-select or unselected elements, and thus the concept of using a memory material such as a solid electrolyte material as a rectifier need not apply to full-select architectures only.

For both SET and RESET operations, the focus is placed on Scheme 2 although it is entirely possible to perform these operations with a different set of voltages on the selected and unselected memory lines. Also, it should be noted that details regarding the read operation are shown for example purposes only, as a similar analysis can be extended to set/reset pulses without departing from the scope of the present invention. In such an extension, the goal is to program the rectifying element, then read/set/erase the resistive memory element, and finally put the rectifying element into the high resistance state while making sure that the final state of the resistive memory element is the one desired.

V. SET:

The SET operation (or sequence of operations) is fundamentally similar to the read operation since typical SET time scales are >>30 ns, and hence the SE can be assumed to be in the steady state at the end of the SET cycle with a voltage $V_{th}$ across it, although this is not a necessary condition.

The major differences include the following:
 (a) One needs to be mindful of the maximum voltage being applied across the MEM+SE stack since it is limited by the RESET operation of the MEM—i.e., the MEM should not be inadvertently RESET during an SE erase.
 (b) In certain memory elements, SET may involve higher temperatures at the memory region—typically between 400° C. and 500° C. (although this is not necessarily the case for all memory materials). This means that (due to thermal diffusion) it is possible that the SE may not be at room temperature. This affects various parameters for the SE including $V_{th}$, $V_E$, etc. Depending on how the device is designed (device structure, thermal boundary conditions, etc.), the temperature in the SE can be kept to less than 125° C. It should be noted that the temperature affects $V_A$, $V_{th}$ and $V_B$ for the SE (for GeSe with Ag–$V_{th}$ ($V_E$) decrease by 50 (−30 mV) for approximately 140° C. change in temperature). If the SET operation for MEM has just 1 pulse, then in principle one must choose the lowest possible current and set for the longest possible time (maybe even 10 µs)—in order to give adequate margin between SET and RESET over the memory and SE resistance/material variability.
 (c) Electrical and thermal disturbs are concerns in any crosspoint architecture. It should be noted that in crosspoint memory, disturbs are always an issue. In such a crosspoint memory (MEM+SE), there are 2 kinds of disturbs—electrical and thermal. Electrical disturbs arise from coupling of the potentials from the wordline and bitline to adjacent lines causing inadvertent programming. Thermal disturbs arise because both the MEM and SE elements can become very hot during SET and/or RESET operations if there are high current densities involved. These hot elements can cause an inadvertent SET operation in an adjacent cell that may have been earlier RESET (due to physical proximity). In addition, the high temperatures involved can also cause the $V_{th}$ and $V_A$ of the SE of an adjacent cell to drop, which can cause accidental turn-on (especially when coupled with electrical disturbs). While it is highly unlikely that such an operation might result in an accidental SET or RESET operation, it is still possible for the SE to get converted into the low resistance state. This can make the crossbar array operation harder because of the increased leakage in the diode.

Figure 7A:
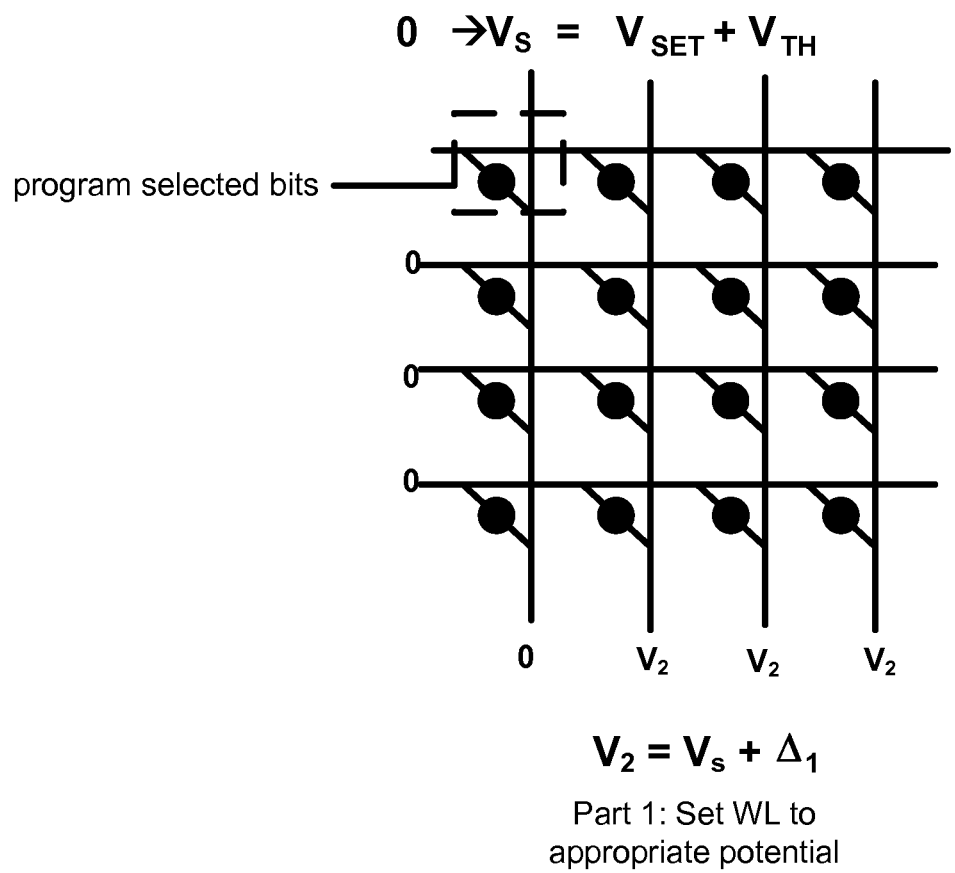
FIGS. 7a-b illustrates an implementation of the SET operation intended to put the memory element into the low resistance state.

As with the read operation, numerous cases are possible, so just a few representative cases are described herein. An important parameter that decides the SET sequence is the maximum value of $V_E/V_{th}$. If M=max($V_E/V_{th}$)<1, then the issues are much less severe. In this case, there is only one sequence of pulses. In the more general case (if M>1 and MEM devices show considerable device to device variability), then a sequence of pulses needs to be applied. Let us start with the simple case:

Va. SET Operation—Case 1:

FIG. 7a illustrates part 1 of Case 1 (SE Set, MEM Set). The device (array) is biased as follows. The selected WL is biased at "$V_S$" (unselected WLs at 0V—it should be noted that, as described before, this choice of voltages is arbitrary) and the selected bitline(s) is(are) grounded (unselected BLs are at "$V_2$"). Note that this has the effect of forward biasing the selected "stack" (=MEM+SE). All the remaining cells are either 0 or negative biased (in principle even a small positive voltage is OK). Since the SE is in the OFF state, having a 0 or negative bias keeps all but selected SE elements in the high resistance state (for V=3, the leakage of a 90×90 nm device is 10 pA for Ge-rich sulfide). Therefore, only selected SE elements conduct and the SE at the selected node(s) gets converted to the low resistance state. It should be noted that "$V_S$" is chosen so that when the SE conducts and the MEM snaps from the high resistance state to the low resistance state, the voltage across the MEM is approximately $V_{set}$. Also, it should be noted that the CMOS driver connected to the selected WL can limit the voltage to "$V_S$" and current to a maximum value of "$I_{set}$". Within approximately 10-50 ns (although this can typically be much higher and depends on the material), the solid electrolyte memory element can reach the steady state resistance corresponding to $I_{set}$ (i.e., R(SE)=$V_{th}/I_{set}$) (although this is not a necessary condition and this only changes the voltage amplitude condition). The voltage across the MEM stabilizes to $V_{SET}$ and in a time scale of the order of 10 ns-10 µs (depending on the memory material, the SE material properties and the device structure), the MEM element can get SET.

While the SE is reaching steady state (and has a metallic filament), if there is enough current flowing through MEM, the MEM element heats up (typical temperatures during SET can range from 150° C. to 500° C.). Since the SET operation is assumed to be relatively long, the entire ambient around the MEM region that is being SET can heat up. If the SE is not room temperature, consideration needs to be given to what the $V_{th}$ and $V_B$ of the SE would be—for example if its temperature were variable along its thickness.

Figure 7B:
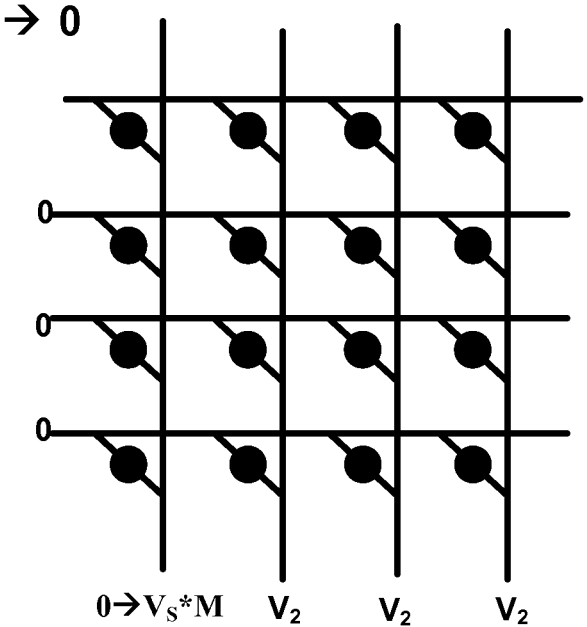

FIG. 7b illustrates part 2 of Case 1 (SE erase, MEM to remain SET), although this is just one of many possibilities. In this case, the WL is brought back to ground and the "selected" bitlines are pulled up to $M*V_S$ where M=max ($V_{EM}/V_{th}$) (this could be done simultaneously (within a few ns) or sequentially). If M<=1, then there is no problem. If the set current and voltage are chosen appropriately, then one can be assured that even with M>=1, one will not inadvertently erase or reset the memory element. This requires a low SET current (and a long SET operation). In any case, the SE will be in the high resistance state after this operation.

However, there may be considerable device to device variability between different cells, in which case it may be hard to target a particular value of SET current or a SET voltage. For example, if the critical dimension (or the resistivity) of the MEM is smaller (higher) in a particular region, then the same current might end up inadvertently resetting or erasing the memory. This problem becomes even harder if M>1.

This necessitates the need for an iterative technique that repeatedly applies different voltages (in diminishing magnitude) to the device. This is very similar to the Multiple Step-Down Pulse Geneator (MSPG) technique applied by Samsung® for the 1-transistor 1-resistor cell for phase change memory, except that, in this case, one is also concerned with putting the SE back into the high resistance state.

Figure 8:
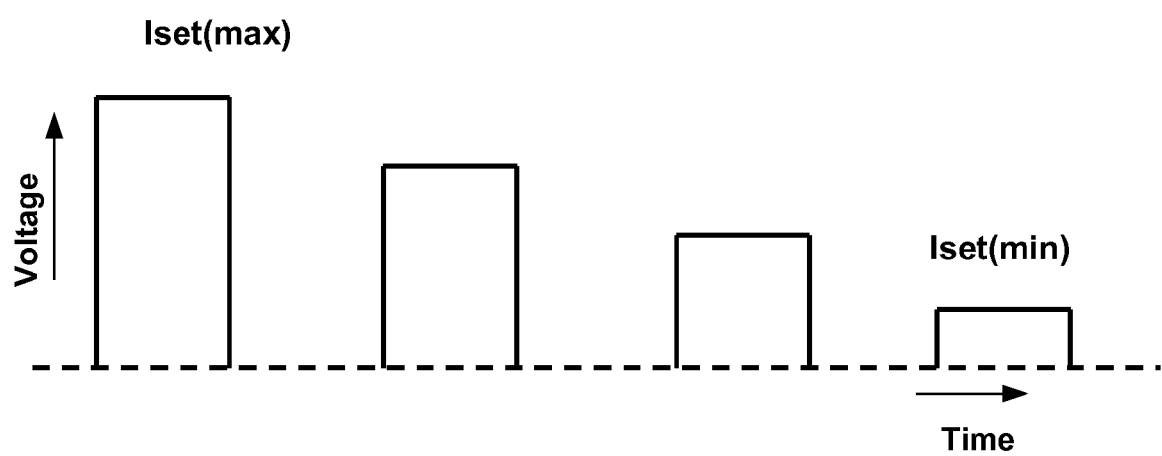
FIG. 8 illustrates an example of the Multiple Step-down Pulse Generator (MSPG) technique from Samsung® for the SET operation.

FIG. 8 illustrates an example of the MSPG Technique from Samsung®. When this technique is applied to an FET+phase change memory (PCM) (1T 1R architecture), a sequence of pulses is applied with diminishing voltage values. This ensures that all cells get the SET operation even with significant device to device variability. $I_{set}$(max), $I_{set}$(min), and the number of pulses are chosen dependent on the degree of variability.

Figure 9:
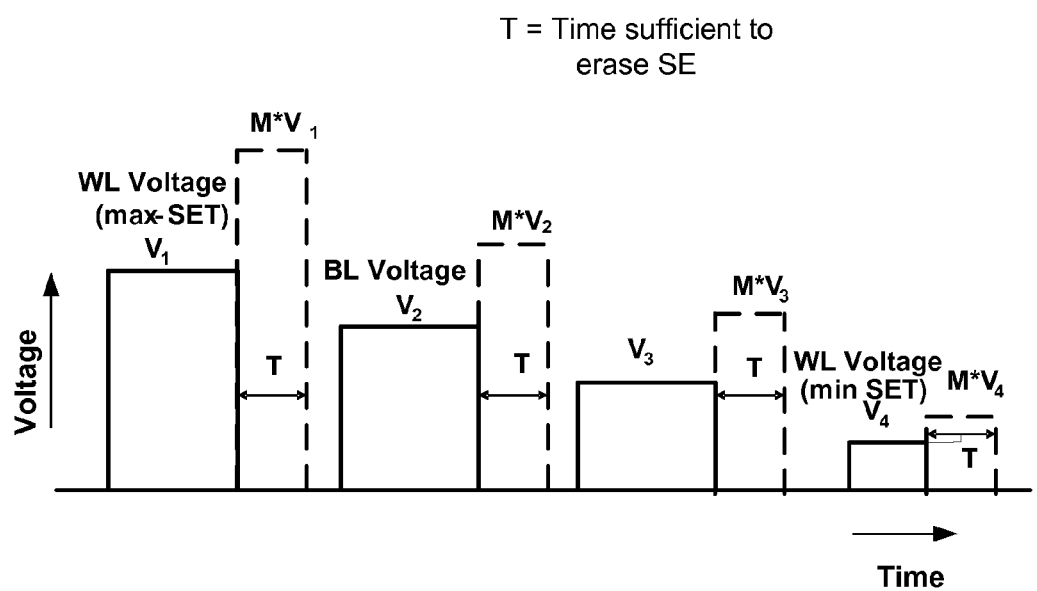
FIG. 9 illustrates a typical MSPG operation for SET for an MEM+SE crossbar architecture.

Vb. SET Operation—Case 2—Sequential Pulses:

FIG. 9 illustrates a possible MSPG operation for SET for an MEM+SE crossbar architecture. The solid-lined pulses refer to WL pulses and the dotted-lined pulses refer to the bitline pulses across the selected cell. If M<=1, then there is no problem since the bitline pulses do not end up resetting the MEM. In this case, the bitline pulses are chosen to be identical to the wordline pulses. Further, with respect to FIG. 9, $V_2=V_1/M$ and $V_3=V_2/M$ (geometric series) where M is between 1 and 1.25 for AgGe—S and is less than 1 for CuGe—S.

The more interesting case is when M>=1. In this case, the bitline pulse has to be higher than the WL pulse. As will be seen later, it is important to ensure that the WL and BL pulses transition within 1 ns (or within the thermal time constant of the system if thermal effects are important). For example: for the first pulse, as the WL voltage drops from $V_1$ to 0, the bitline voltage should increase from 0 to $M*V_1$, where M is chosen based on a number of factors including the ratio of erase threshold to the electrodeposition threshold, retention properties of the SE, etc. The time for each wordline pulse is in the 10 ns to 1 μs range. The time T (for the BL pulse) is in the 10 ns-100 ns range (since the SE has to be erased). The total time would range from 100 ns to 10 μs. The times chosen depend on the speeds of the SE material and the memory material may vary.

Figure 10:
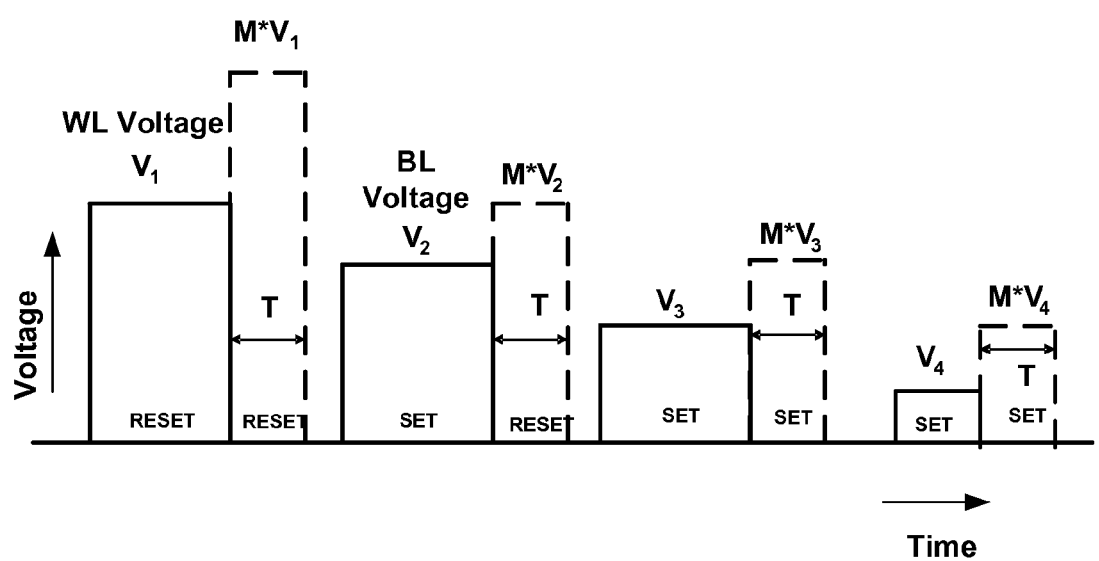
FIG. 10 illustrates one case where a device with a much lower SET (and RESET current) is targeted.

Next, as an example, the evolution of the MEM state through multiple pulses is addressed. FIG. 10 illustrates this particular case where a device with a much lower SET (and RESET current) is targeted. In the first WL pulse, the MEM has enough current in it to reset it (i.e. $>I_{reset}$) and the SE goes into the low resistance state=Ra. Note that V(MEM)/[V(SE)=$V_{th}$] is typically greater than 2 or 3. Now the WL is pulsed back to ground and the BL is pulsed back up to $M*V_1$. The pulses have a rise-time and fall-time shorter than a few nanoseconds. This can be important if it is desired that thermal boundary conditions be maintained across the WL swing. Negative voltage across the series stack can cause the SE to switch OFF. As the SE switches OFF, its resistance increases and the voltage dropped across the MEM decreases. In the worst case, if the switch off of SE causes voltage across the MEM to switch from Reset to Read, then the MEM still remains RESET since it has been switch OFF quickly. This is the worst case since the MEM is not in SET condition anymore—in other words in every other case, the MEM would be partially SET. It should be noted that since the MEM voltage dropped by at least 2x (from Reset to Read in this worst case), it means that SE resistance went up by at least 2x. This causes the voltage across the SE to increase, which would cause it to switch it OFF completely.

This argument may be applied to every pulse in the above sequence of pulses. In the example shown above, in the second WL pulse, the MEM element is SET. However, it goes back into the RESET state during the subsequent BL pulse. Subsequent WL and BL pulses reinforce the SET state. The number of pulses that need to be applied is a function of the voltage stepdown ratio and the degree of variability in the system. A voltage stepdown ratio (i.e. $V_2/V_1=V_3/V_2=V_4/V_3$) of 0.7-0.9 is a good choice. Particular choice of pulses depends on the characteristics of the memory and rectifying element.

VI. MEM Reset Operation:

This is similar to the MEM SET operation and may involve either one WL and one BL pulse or a sequence of pulses (with increasing magnitude) in order to reset the MEM. Unlike the case before, a sequence of WL pulses with increasing amplitude is provided, with each WL pulse being followed by a corresponding BL pulse (with a scale factor of M). Between a sequential set of pulses (a WL pulse+a BL pulse is a set of pulses), read operations are performed to see whether the MEM has been Reset or not. This can increase the endurance of the memory element.

One of the possible requirements in order for this particular scheme to work is that during the BL pulse, the metal filament in the SE element switches OFF to a high resistance state before the MEM quenches. If this happens, its resistance increases by several orders of magnitude and the MEM element remains reset while the SE switches OFF. This could be made easier if the temperature in the SE region is high—which causes the metallic filament to easily break off. Device structure engineering with the memory and SE materials (for example with fast SE materials) are important in this regard.

VII. Possible Structures:

There are a number of possible structures that combine the memory materials and the SE concept. FIGS. 11a-f illustrate some exemplary examples of various memory material cell structures of interest.

Figure 11A:
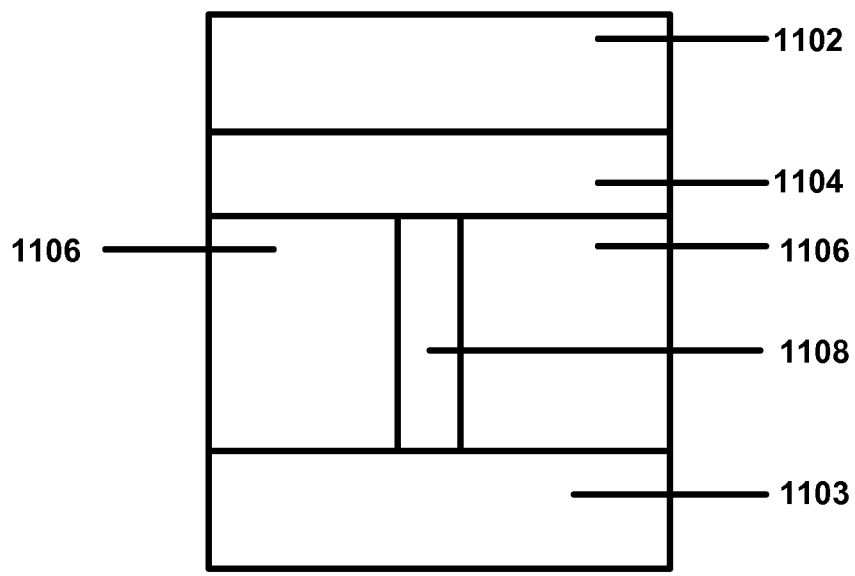
FIGS. 11a-f illustrate non-limiting examples of various MEM cell structures of interest.
Figure 11B:
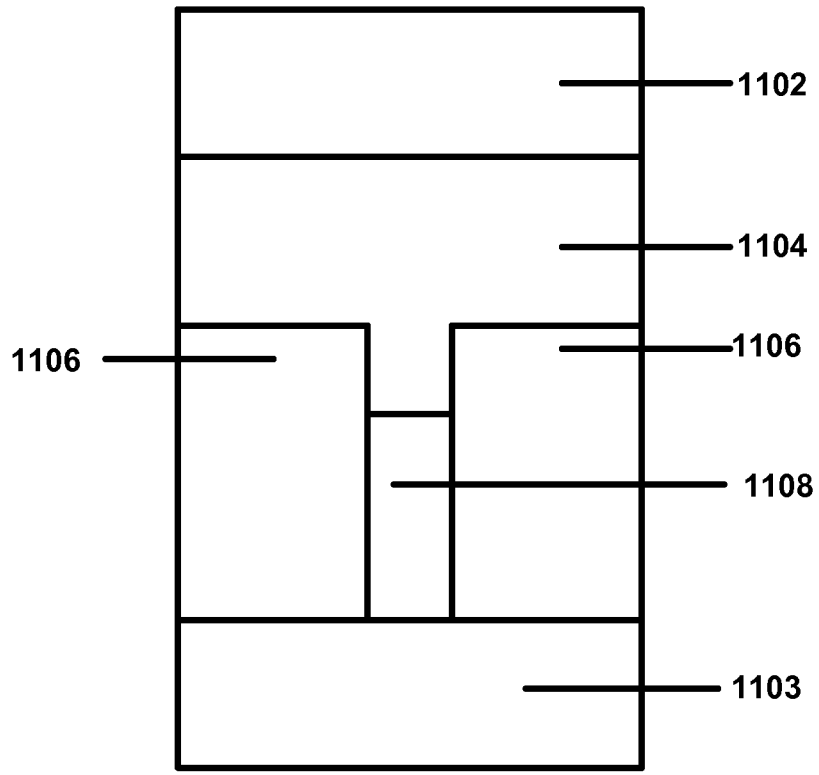
Figure 11C:
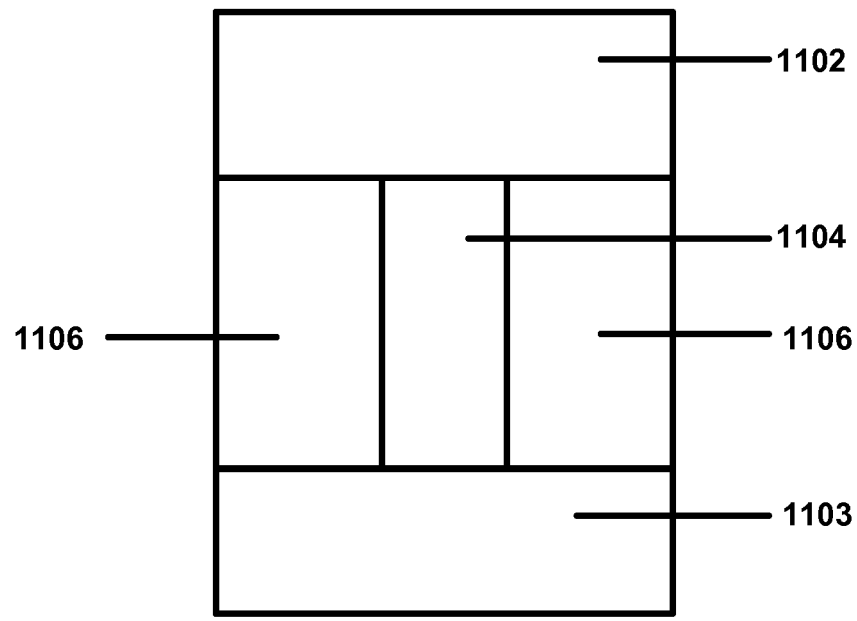
Figure 11D:
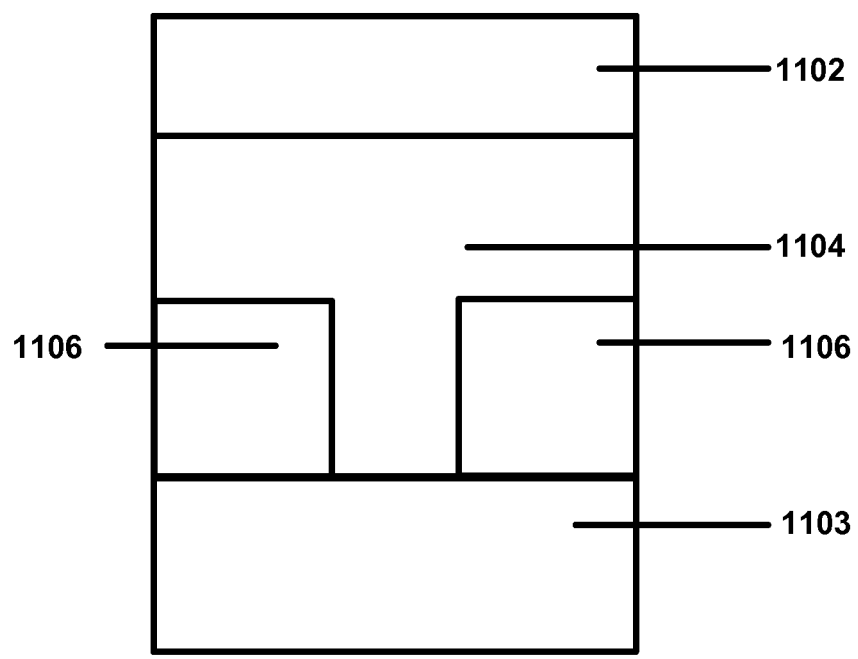
Figure 11E:
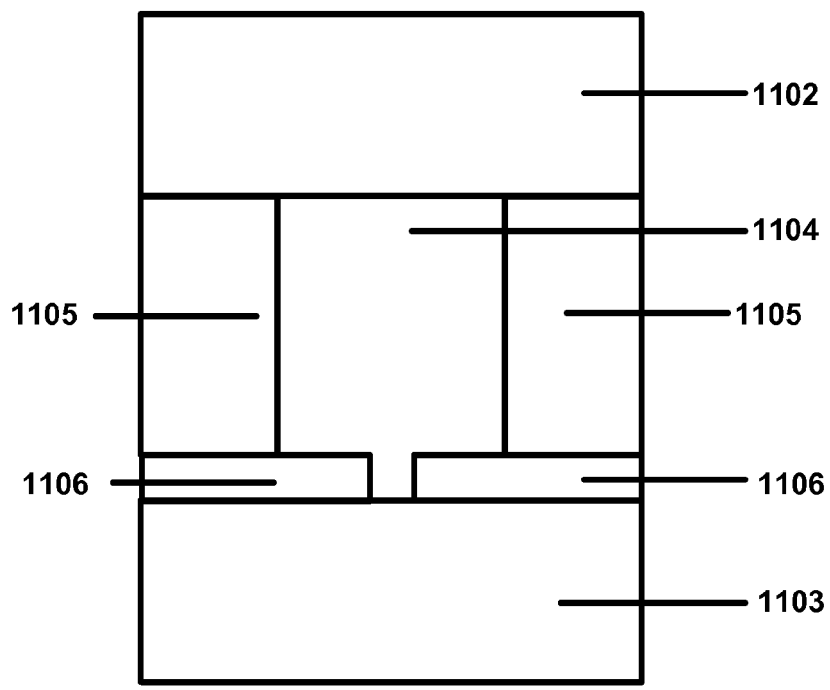
Figure 11F:
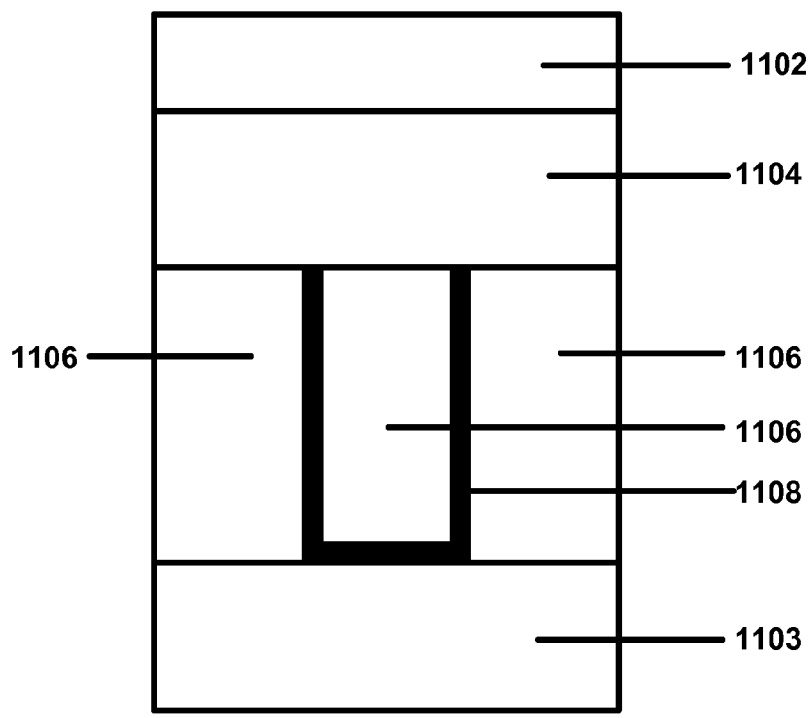

FIG. 11a illustrates a mushroom shaped embodiment of the MEM cell structure. FIG. 11b illustrates a recessed mushroom shaped embodiment of the MEM cell structure. FIG. 11c illustrates a pillar cell shaped or lithographically defined pore embodiment of the MEM cell structure. FIG. 11d illustrates a litho pore embodiment of the MEM cell structure. FIG. 11e illustrates a sublitho pore embodiment of the MEM cell structure. FIG. 11f illustrates a ring shaped embodiment of the MEM cell structure. In this case, MEM refers to any generic memory structure described earlier. In FIGS. 11a-f, top layer 1102 and bottom layer 1103 are a metal layer formed of, for example, TiN or W or Cu with optional barrier layers if necessary. Layer 1104 is the memory layer, layer 1106 is a layer formed of, for example, oxide/nitride/dielectric/silicon or some combination of these layers, and layer 1108 is a metal layer formed of, for example, TiN or W. Layer 1105 is another layer of dielectric material and could be oxide/nitride/oxynitride, etc.

Further, for the mushroom (FIG. 11a), recessed mushroom (FIG. 11b) and the ring-shaped cell (FIG. 11f), while the bottom electrode 1103 (made, for example, from TiN or W or Cu) is typically a small-area contact, the memory material could be a line-type or a "via-fill" type material (i.e., patterned in one dimension versus two dimensions). Similarly, for the litho pore embodiment shown in FIG. 11d and the sublitho pore embodiment shown in FIG. 11e, two options are possible where the bottom small-area via is 2D, but the top-pore could be either line type or via-fill type. The pillar embodiment shown in FIG. 11c is confined in both directions (i.e. 2D). Optional barrier layers, adhesion layers, passivation layers and capping layers have not been shown for convenience.

Some of the possible SE options are:
(a) Pore SE device—similar to the MEM pore shown earlier in FIGS. 11c-e, except with the memory material 1104 replaced with solid electrolyte material.
(b) Mushroom SE device—similar to the Mushroom MEM device shown earlier in FIG. 11a-b, except with the memory material 1104 replaced with solid electrolyte material.
(c) Unpatterned SE device—i.e., continuous layer between the top and bottom electrodes with one electrode being inert (e.g., one electrode being formed with W/TiN/Al or Cu/Ag with TiN barriers, while the other electrode being formed with Cu with an Ag barrier).

It should be noted that for all of the above-mentioned structures show in FIGS. 11a-f, at least one electrode has to be inert (W/TiN/Al) and the other may be oxidizable (Ag/Cu). If both of the electrodes have to be made with Cu, then at least one of them has to have an inert liner.

Options illustrated in FIGS. 11a-f of MEM can be combined with options (a) through (f) for SE to yield an acceptable MEM+SE stack with at least 36 device structure combinations although other combinations can be constructed based on the teachings of the present invention. Each combination could be fabricated using any one out of many process flows.

Figure 12A:
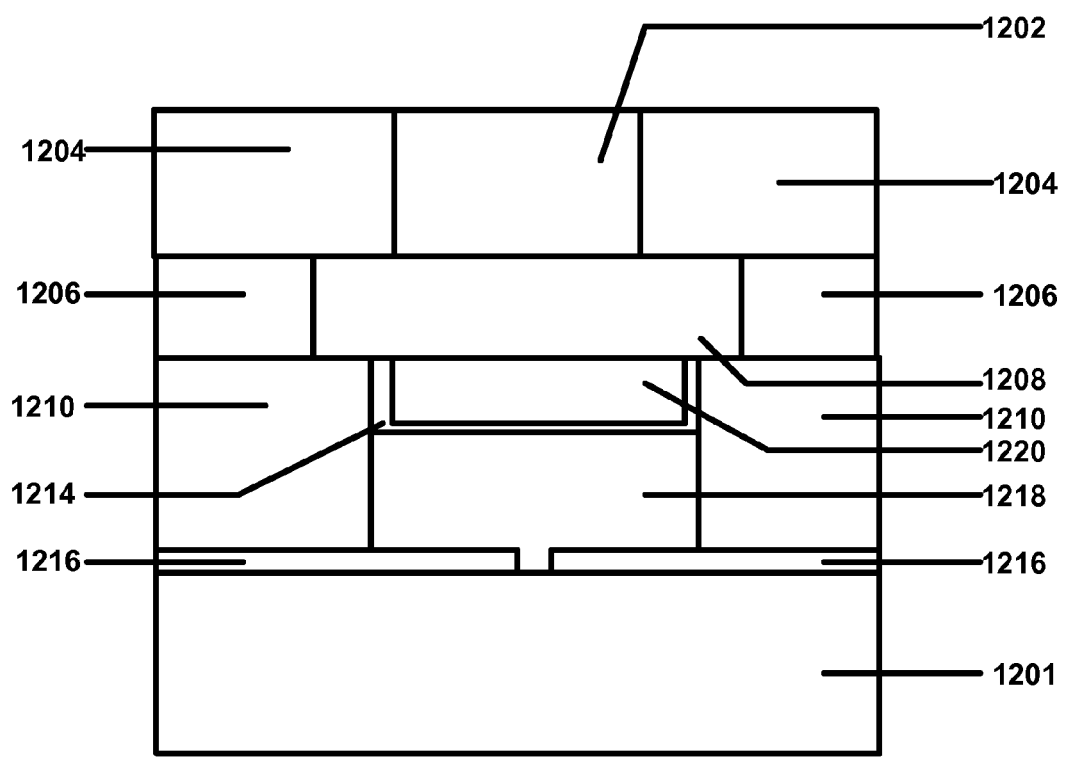
FIG. 12a illustrates a cross-section of a combination of an MEM sublitho pore device with an patterned SE.

For example, FIG. 12a illustrates a combination of an MEM sublitho pore device with a patterned SE. The structure of FIG. 12a comprises the following layers: lower metal layer 1201, formed of, for example, TiN or W or Cu (with barrier layers), a first set of dielectric layers 1216, memory layer 1218 (which could comprise a set of memory materials of varying composition), a second set of dielectric layers 1210, another metal layer 1214 formed of, for example, TiN or W, an Ag/Cu layer 1220, an SE layer 1208, a third set of dielectric layers 1206, an upper metal layer 1202 formed of, for example, TiN or W, and a fourth set of dielectric layers 1204. The memory layer 1218 and the SE layer 1208 may be patterned in one dimension or 2.

Figure 12B:
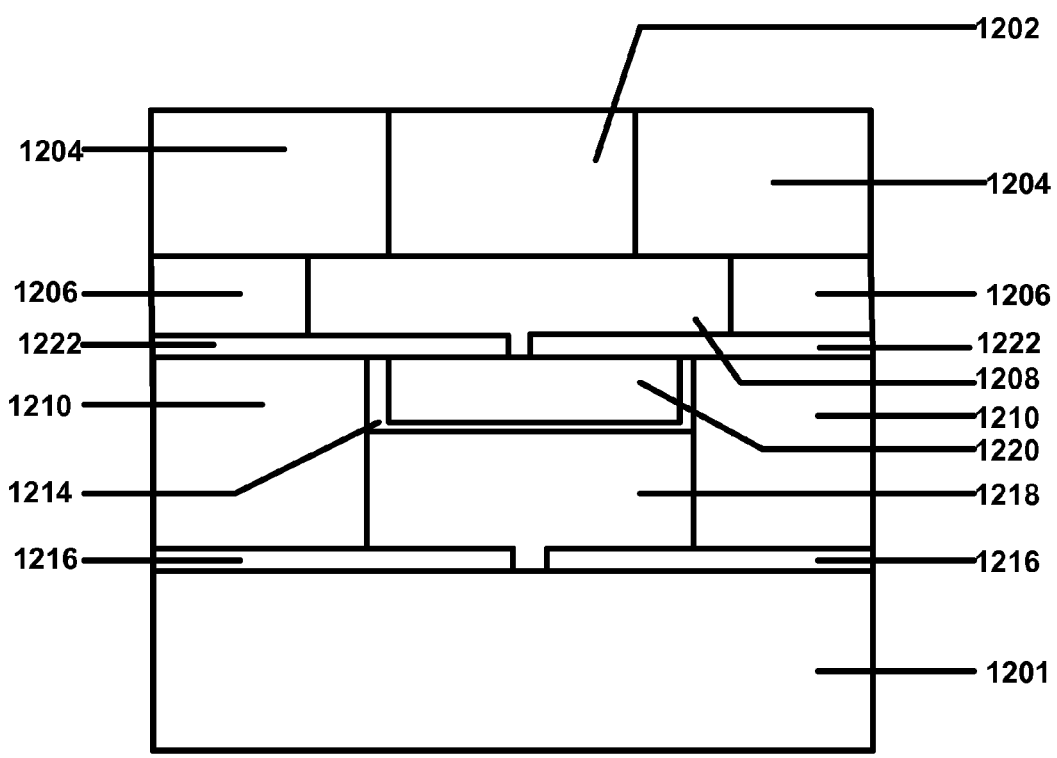
FIG. 12b illustrates a cross-section of a combination of an MEM sublitho pore device with a sublitho pore SE.

As another example, FIG. 12b illustrates a combination of an MEM sublitho pore device with a sublitho pore SE. The structure of FIG. 12b is similar to FIG. 12a, except that the SE layer 1208 is a sublitho pore structure and, in addition to being flanked by the third set of dielectric layers 1206, the sublitho pore structure 1208 is flanked by a fifth set of dielectric layers 1222.

The phrases "diode facing down" and "diode facing up" used in reference to FIGS. 13-19 refer to the orientation of the diode with respect to the substrate. "Diode facing down" refers to the diode facing towards the silicon substrate (or the normal current flow direction is towards the substrate) and "diode facing up" refers to the diode facing away from the substrate (or the normal current flow direction is away from the substrate).

Figure 13:
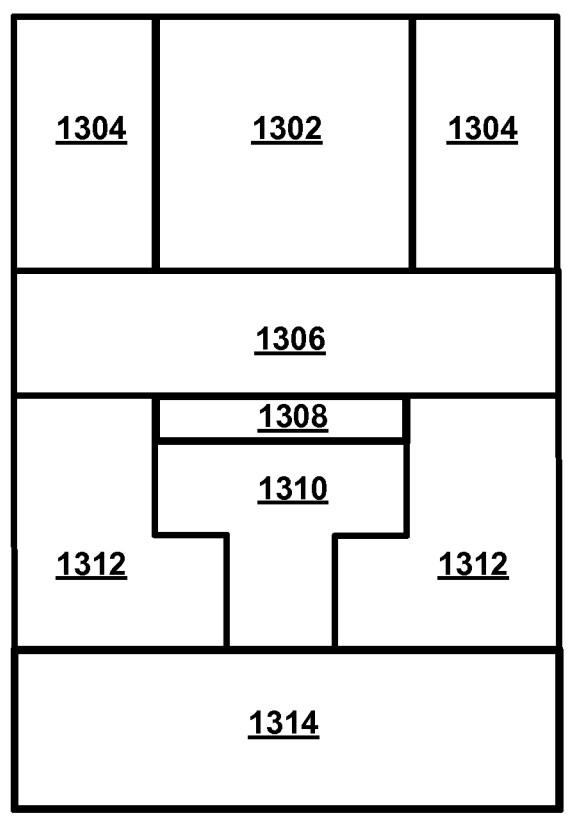
FIG. 13 illustrates a cross-section of a combination of a sublithographic pore memory structure with an unpatterned diode wherein the unpatterned diode faces the silicon substrate which has CMOS circuits.

As another example, FIG. 13 illustrates a combination of a sublitho pore memory structure with an unpatterned diode, wherein the unpatterned diode faces the silicon substrate having CMOS circuits. The structure of FIG. 13 comprises the following layers: oxidizable top electrode 1302 (which can be a combination of different materials Ag/Cu etc with optional barrier layers), a first set of dielectric layers 1304, unpatterned SE material (or combination of SE materials and/or buffer layers, etc) 1306, top electrode 1308, memory material 1310, a second set of dielectric layers 1312, and bottom electrode (made from, for example, a single metal or a combination of metals) 1314.

Figure 14:
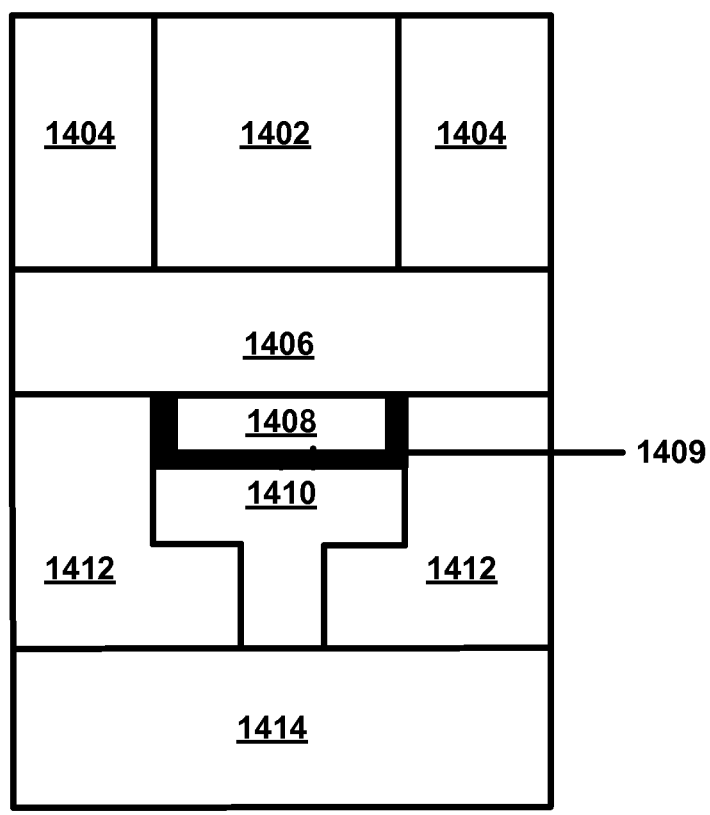
FIG. 14 illustrates a cross-section of a combination of a sublithographic pore memory structure with an unpatterned diode wherein the unpatterned diode faces away from the silicon substrate which has CMOS circuits.

As yet another example, FIG. 14 illustrates a combination of a sublitho pore memory structure with an unpatterned diode, wherein the unpatterned diode faces away from the silicon substrate having CMOS circuits. The structure of FIG. 14 comprises the following layers: inert top electrode 1402 (which can be a combination of inert materials), a first set of dielectric layers 1404, unpatterned SE material (or combination of SE materials and/or buffer layers) 1406, oxidizable top electrode 1408 that has an inert liner 1409, memory material 1410, a second set of dielectric layers 1412, and bottom electrode (made from, for example, a single metal or a combination of metals) 1414.

Figure 15:
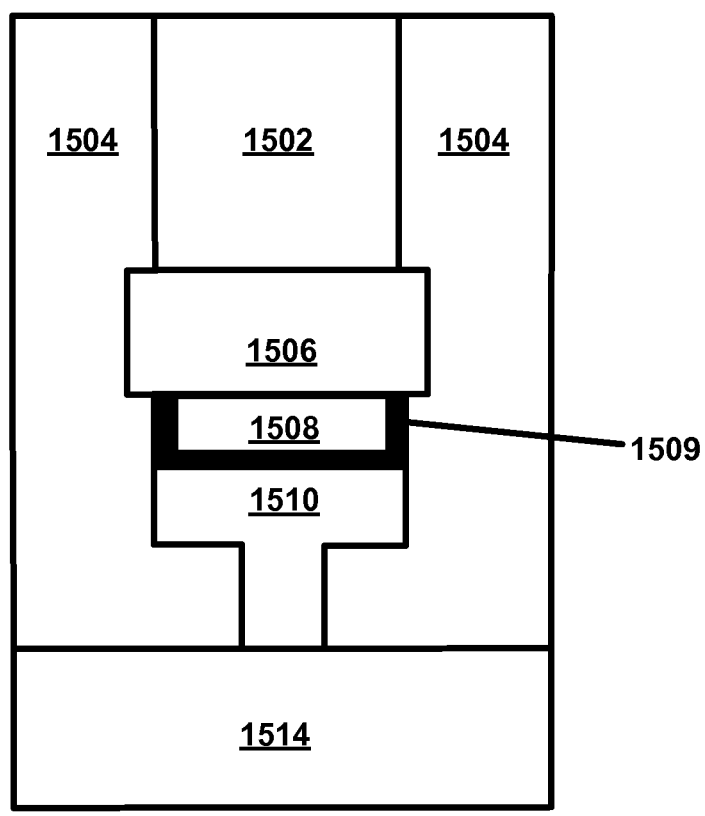
FIG. 15 illustrates a cross-section of a combination of a sublithographic pore memory structure with a patterned diode wherein the patterned diode faces away from the silicon substrate which has CMOS circuits.

As yet another example, FIG. 15 illustrates a combination of a sublitho pore memory structure with a patterned diode, wherein the patterned diode faces away from the silicon substrate having CMOS circuits. The structure of FIG. 15 comprises the following layers: inert top electrode 1502 (which can be a combination of inert materials), a set of dielectric layers 1504, patterned SE material (or combination of SE materials and/or buffer layers) 1506, oxidizable top electrode 1508 that has an inert liner 1509, memory material 1510, and bottom electrode (made from, for example, a single metal or a combination of metals) 1514.

Figure 16:
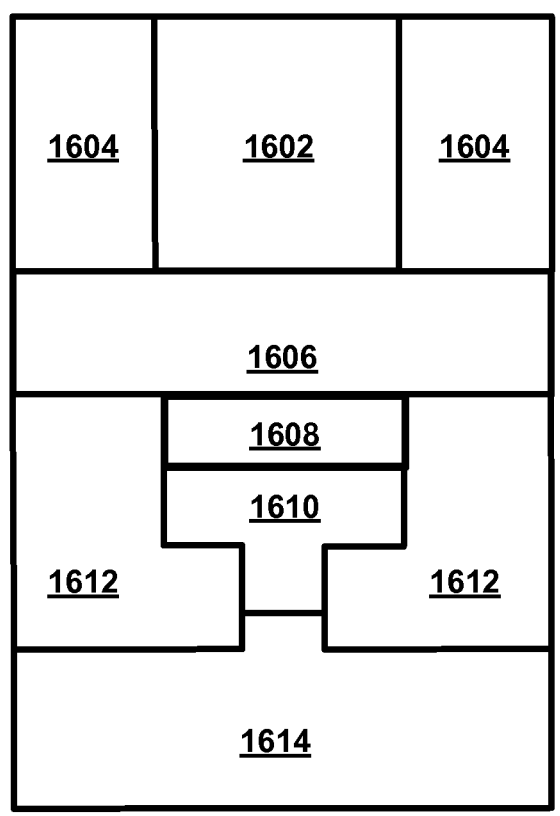
FIG. 16 illustrates a cross-section of a combination of a recessed mushroom memory structure with an unpatterned diode wherein the unpatterned diode faces the silicon substrate which has CMOS circuits.

As yet another example, FIG. 16 illustrates a combination of a recessed mushroom memory structure with an unpatterned diode, wherein the unpatterned diode faces the silicon substrate having CMOS circuits. The structure of FIG. 16 comprises the following layers: oxidizable top electrode 1602 (which can be a combination of different materials with optional barrier layers), a first set of dielectric layers 1604, unpatterned SE material (or combination of SE materials and/or buffer layers) 1606, inert electrode 1608, recessed mushroom memory material 1610, a second set of dielectric layers 1612 and bottom electrode (made from, for example, a single metal or a combination of metals) 1614.

Figure 17:
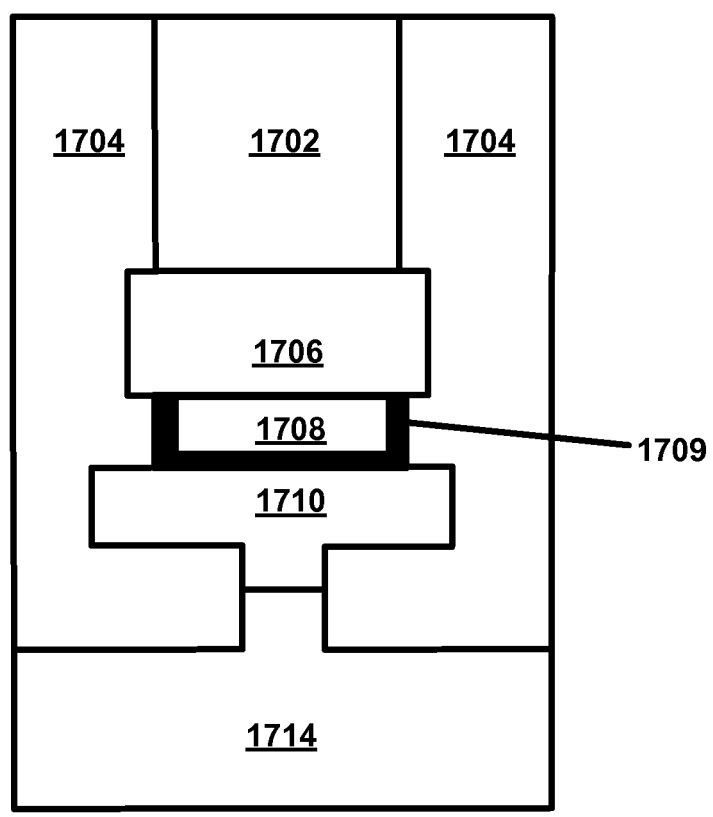
FIG. 17 illustrates a cross-section of a combination of a recessed mushroom memory structure with a patterned diode wherein the patterned diode faces away from the silicon substrate which has CMOS circuits.

As yet another example, FIG. 17 illustrates a combination of a recessed mushroom memory structure with a patterned diode, wherein the patterned diode faces away the silicon substrate having CMOS circuits. The structure of FIG. 17 comprises the following layers: inert top electrode 1702 (which can be a combination of inert materials), a set of dielectric layers 1704, patterned SE material (or combination of SE materials and/or buffer layers) 1706, oxidizable metal electrode 1708 with inert layer 1709, recessed mushroom memory material 1710, and bottom electrode (made from, for example, a single metal or a combination of metals) 1714.

Figure 18:
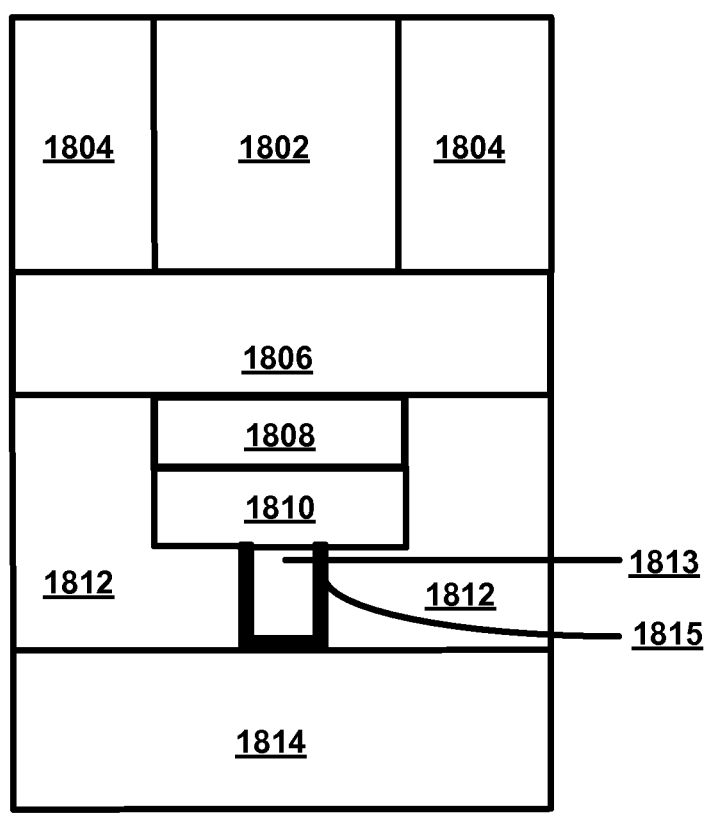
FIG. 18 illustrates a cross-section of a combination of a ring-shaped memory structure with an unpatterned diode wherein the unpatterned diode faces the silicon substrate which has CMOS circuits.

As yet another example, FIG. 18 illustrates a combination of a ring-shaped memory structure with an unpatterned diode, wherein the unpatterned diode faces the silicon substrate having CMOS circuits. The structure of FIG. 18 comprises the following layers: oxidizable top electrode 1802 (which can be a combination of different materials with optional barrier layers), a first set of dielectric layers 1804, unpatterned SE material (or combination of SE materials and/or buffer layers) 1806, top electrode 1808, mushroom memory material 1810, a second set of dielectric layers 1812, a third dielectric region 1813, inert liner 1815, and bottom electrode (made from, for example, a single metal or a combination of metals) 1814.

Figure 19:
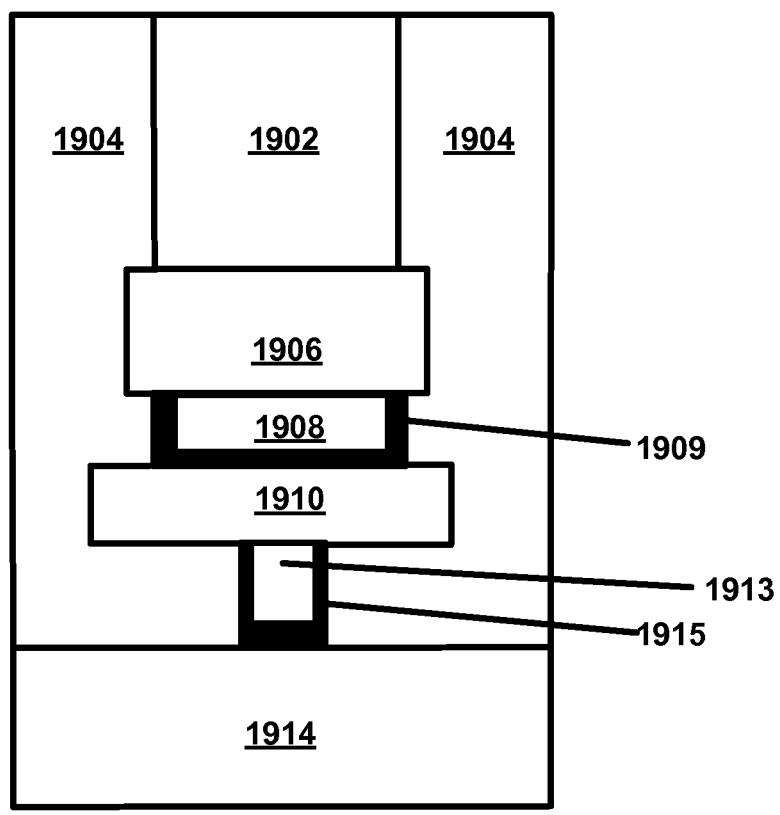
FIG. 19 illustrates a cross-section of a combination of a ring-shaped memory structure with a patterned diode wherein the patterned diode faces away from the silicon substrate which has CMOS circuits.

As yet another example, FIG. 19 illustrates a combination of a ring-shaped memory structure with a patterned diode, wherein the patterned diode faces away from the silicon substrate having CMOS circuits. The structure of FIG. 19 comprises the following layers: inert top electrode 1902 (which can be a combination of inter material), a set of dielectric layers 1904, patterned SE material (or combination of SE materials and/or buffer layers) 1906, oxidizable top metal electrode 1908 with inert layer 1909, memory material 1910, dielectric 1913, inert liner 1915, and bottom electrode (made from, for example, a single metal or a combination of metals) 1914.

It should be noted that FIGS. 11-19 are exemplary only and the layers in these figures could comprise multiple layers each. For example, the regions that indicate metal could comprise a series of metal/conductive layers with optional barrier layers and optional adhesion layers. Similarly the memory layers could comprise a series of layers with varying resistivity and/or concentration and may include optional dielectric layers, buffer layers and adhesion layers. The dielectrics themselves could consist of a series of dielectric layers. In the case of resistive memory elements which snap back from a high resistance state to the low resistance state (where snap back refers to the reduction in voltage as the memory element transitions from the high R state to the low R state), an additional series resistance could be employed and made in a conductive layer/dielectric layer or the memory layer itself (not shown for simplicity). In addition, it might be desirable to separate the solid electrolyte material and the memory material by metals or semiconductors if thermal isolation is important. Also, the preferred thickness of the various layers shown in each of these structures of FIGS. 11-19 may range from 1 nm to 5000 nm, preferably between 1 nm to 1 μm.

It should be noted that the above device structures of 11-19 can be fabricated using conventional semiconductor processing techniques. For example, the various layers of the structures shown in FIGS. 11-19 can be deposited using a variety of different techniques including, but not limited to, Chemical Vapor deposition (CVD), Physical Vapor deposition techniques (PVD—for example sputtering, evaporation etc), spin-on techniques, Atomic Layer deposition techniques (ALD), etc. Also, specific features of FIGS. 11-19 can be defined using various lithography techniques, etching, chemical mechanical polishing, liftoff, etc. For fabricating each of these structures, various possible process flows are possible.

CONCLUSION

A system and method have been shown in the above embodiments for the effective implementation of a crosspoint array having crossbar elements having a solid electrolyte material used as a rectifier with a symmetric or substantially symmetric resistive memory. While various preferred embodiments have been shown and described, it will be understood that there is no intent to limit the invention by such disclosure, but rather, it is intended to cover all modifications falling within the spirit and scope of the invention, as defined in the appended claims. For example, the present invention should not be limited by specific voltage values at which bitlines and wordlines are driven by the illustrated structures.

I claim:

1. A crosspoint array comprising:
   a plurality of bitlines and wordlines; and
   a plurality of crossbar elements, each crossbar element disposed between a bitline and a wordline and each crossbar element comprising at least a solid electrolyte material used as a rectifier in series with a symmetric or substantially symmetric resistive memory node, where one or more of said crossbar elements are responsive to the following voltages:
   a first set of voltages to transition said solid electrolyte in said crossbar elements from an OFF state to an ON state;
   a second set of voltages to read or program said symmetric resistive memory, and
   a third set of voltages to transition solid electrolyte from an ON state to a OFF state.

2. The crosspoint array of claim 1, wherein said solid electrolyte device, in said ON state has a first resistance, $R_{ON}$, and in an OFF state has a second resistance, $R_{OFF}$, with $R_{OFF}/R_{ON} \geq 10^4$.

3. The crosspoint array of claim 1, wherein said solid electrolyte device, in an ON state, supplies an ultrahigh current density that is greater than $10^6$ A/cm$^2$ to said symmetric or substantially symmetric resistive memory.

4. The crosspoint array of claim 1, wherein said solid electrolyte material includes at least one of the following: germanium sulfide ($Ge_xS_{1-x}$), germanium selenide ($Ge_xSe_{1-x}$), germanium telluride ($Ge_xTe_{1-x}$), silicon sulfide ($Si_xS_{1-x}$), silicon selenide ($Si_xSe_{1-x}$), silicon telluride ($Si_xTe_{1-x}$), arsenic sulfide ($As_xS_{1-x}$), arsenic selenide ($As_xSe_{1-x}$), arsenic telluride ($As_xTe_{1-x}$), lead sulfide ($Pb_xS_{1-x}$), lead selenide ($Pb_xSe_{1-x}$), lead telluride ($Pb_xTe_{1-x}$), cadmium sulfide ($Cd_xS_{1-x}$), cadmium selenide ($Cd_xSe_{1-x}$), cadmium telluride ($Cd_xTe_{1-x}$), zinc sulfide ($Zn_xS_{1-x}$), zinc selenide ($Zn_xSe_{1-x}$), zinc telluride ($Zn_xTe_{1-x}$), silver sulfide ($Ag_xS$), silver selenide ($Ag_xSe$), copper sulfide ($Cu_xS$), copper selenide ($Cu_xSe$), tungsten oxide ($WO_x$), copper oxide ($Cu_xO$), silver (Ag), copper (Cu), lithium (Li), sodium (Na), and zinc (Zn).

5. The crosspoint array of claim 1, wherein said solid electrolyte material is silver sulfide ($Ag_xS$).

6. The crosspoint array of claim 1, wherein said solid electrolyte material is copper sulfide ($Cu_xS$).

7. The crosspoint array of claim 1, wherein said solid electrolyte material is germanium sulfide ($Ge_xS_{1-x}$) in combination with silver (Ag).

8. The crosspoint array of claim 1, wherein, after a program, read, and/or erase operation of said memory element, an erasure of said solid electrolyte is accelerated by maintaining said solid electrolyte, at least during said erasure, at a temperature greater than 100° C.

9. The crosspoint array of claim 1, wherein, in one or more of said crossbar elements, said solid electrolyte is initially brought from a high resistance OFF state to a low resistance ON state, a program, read, or erase operation of the memory element is carried out, and then said solid electrolyte is brought from an ON state with low resistance $R_{ON}$ to an OFF state with high resistance $R_{OFF}$ by applying at least a set of pulses to the crosspoint array.

10. The crosspoint array of claim 1, wherein said symmetric or substantially symmetric resistive memory is at least one of the following: phase change memory (PCM), magnetoresistive random access memory (MRAM), ferroelectric random access memory (FeRAM), organic resistive memory, complex metal oxide, perovskite memory, and oxide resistive memory.

11. A method for use with the crosspoint array of claim 1, comprising the steps of:
    applying a first set of voltages to at least one of said crossbar elements, said first set of voltages transitioning said solid electrolyte in said crossbar elements from an OFF state to an ON state;
    applying a second set of voltages to at least one of said crossbar elements, said second set of voltages reading or programming said symmetric resistive memory, and
    applying a third set of voltages to at least one of said crossbar elements, said third set of voltages transitioning solid electrolyte from an ON state to a OFF state.

12. The method of claim 11, wherein said solid electrolyte device, in said ON state has a first resistance, $R_{ON}$, and in an OFF state has a second resistance, $R_{OFF}$, with $R_{OFF}/R_{ON} \geq 10^4$.

13. The method of claim 11, wherein said solid electrolyte device, in an ON state, supplies an ultrahigh current density that is greater than $10^6$ A/cm$^2$ to said symmetric or substantially symmetric resistive memory.

14. The method of claim 11, wherein said solid electrolyte material includes at least one of the following: germanium sulfide ($Ge_xS_{1-x}$), germanium selenide ($Ge_xSe_{1-x}$), germanium telluride ($Ge_xTe_{1-x}$), silicon sulfide ($Si_xS_{1-x}$), silicon selenide ($Si_xSe_{1-x}$), silicon telluride ($Si_xTe_{1-x}$), arsenic sulfide ($As_xS_{1-x}$), arsenic selenide ($As_xSe_{1-x}$), arsenic telluride ($As_xTe_{1-x}$), lead sulfide ($Pb_xS_{1-x}$), lead selenide ($Pb_xSe_{1-x}$), lead telluride ($Pb_xTe_{1-x}$), cadmium sulfide ($Cd_xS_{1-x}$), cadmium selenide ($Cd_xSe_{1-x}$), cadmium telluride ($Cd_xTe_{1-x}$), zinc sulfide ($Zn_xS_{1-x}$), zinc selenide ($Zn_xSe_{1-x}$), zinc telluride ($Zn_xTe_{1-x}$), silver sulfide ($Ag_xS$), silver selenide ($Ag_xSe$), copper sulfide ($Cu_xS$), copper selenide ($Cu_xSe$), tungsten oxide ($WO_x$), copper oxide ($Cu_xO$), silver (Ag), copper (Cu), lithium (Li), sodium (Na), and zinc (Zn).

15. The method of claim 11, wherein said solid electrolyte material is silver sulfide ($Ag_xS$).

16. The method of claim 11, wherein said solid electrolyte material is copper sulfide ($Cu_xS$).

17. The method of claim 11, wherein said solid electrolyte material is germanium sulfide ($Ge_xS_{1-x}$) in combination with silver (Ag).

18. The method of claim 11, wherein said method further comprises, after a program, read, and/or erase operation of said memory element, accelerating an erasure of said solid electrolyte by maintaining said solid electrolyte, at least during said erasure, at a temperature greater than 100° C.

19. The method of claim 11, wherein, in one or more of said crossbar elements, said method comprises bringing said solid electrolyte from a high resistance OFF state to a low resistance ON state, carrying out a program, read, or erase operation of the memory element, and bringing said solid electrolyte from an ON state with low resistance $R_{ON}$ to an OFF state with high resistance $R_{OFF}$ by applying at least a set of pulses to the crosspoint array.

20. The method of claim 11, wherein said symmetric or substantially symmetric resistive memory is at least one of the following: phase change memory (PCM), magnetoresistive random access memory (MRAM), ferroelectric random access memory (FeRAM), organic resistive memory, complex metal oxide, perovskite memory, and oxide resistive memory.

* * * * *